(12) United States Patent
Hoffman

(10) Patent No.: US 12,278,466 B2
(45) Date of Patent: Apr. 15, 2025

(54) SYSTEM AND METHOD FOR RELOCATING BRANCH CIRCUIT ELECTRICAL CABLES FROM AN EXISTING ELECTRICAL ENCLOSURE

(71) Applicant: Jeremy P. Hoffman, Newtown, PA (US)

(72) Inventor: Jeremy P. Hoffman, Newtown, PA (US)

( * ) Notice: Subject to any disclaimer, the term of this patent is extended or adjusted under 35 U.S.C. 154(b) by 78 days.

(21) Appl. No.: 18/305,290

(22) Filed: Apr. 21, 2023

(65) Prior Publication Data

US 2023/0344202 A1 Oct. 26, 2023

Related U.S. Application Data

(60) Provisional application No. 63/333,333, filed on Apr. 21, 2022.

(51) Int. Cl.
| | |
|---|---|
| *H02B 1/06* | (2006.01) |
| *H02B 1/30* | (2006.01) |
| *H02G 3/08* | (2006.01) |
| *H05K 5/04* | (2006.01) |

(52) U.S. Cl.
CPC ............... *H02B 1/06* (2013.01); *H02B 1/305* (2013.01); *H02G 3/086* (2013.01); *H05K 5/04* (2013.01)

(58) Field of Classification Search
CPC .......... H02B 1/056; H02B 1/06; H02B 1/066; H02B 1/305; H02G 3/08; H02G 3/086; H02G 15/10; H05K 5/0204; H05K 5/0217; H05K 5/0247; H05K 5/04
See application file for complete search history.

(56) References Cited

U.S. PATENT DOCUMENTS

| | | | | |
|---|---|---|---|---|
| 1,104,930 A | * | 7/1914 | Boyton | H02G 3/086 |
| | | | | 220/DIG. 25 |
| 1,249,313 A | * | 12/1917 | Raquette | H02G 3/086 |
| | | | | 220/DIG. 25 |
| 1,604,516 A | * | 10/1926 | Jacobsen | H02G 3/086 |
| | | | | 220/3.92 |
| 6,570,754 B2 | * | 5/2003 | Foley | H02B 1/056 |
| | | | | 361/652 |
| 6,585,486 B2 | | 7/2003 | Birdsell et al. | |
| 6,920,038 B2 | * | 7/2005 | Gehlbach | H02B 1/056 |
| | | | | 361/822 |
| 2007/0291433 A1 | | 12/2007 | Ziegler et al. | |
| 2021/0257817 A1 | * | 8/2021 | Seubert | H02B 1/202 |

FOREIGN PATENT DOCUMENTS

WO 2014/047716 A9 4/2014

OTHER PUBLICATIONS

International Application No. PCT/US23/66093—International Search Report and Written Opinion, 8 pages.

* cited by examiner

*Primary Examiner* — Robert J Hoffberg
(74) *Attorney, Agent, or Firm* — Wilkinson Law Office; Clinton H. Wilkinson

(57) ABSTRACT

A system and method for relocating branch circuit electrical cables which enter an existing electrical enclosure, and for which additional cable length is unavailable, to a novel enclosure presenting cable entry points favorably positioned to receive the existing branch circuit cables without additional length required, and in a manner considered safe and repeatable for multiple branch circuit cables to be relocated at present or in the future.

16 Claims, 15 Drawing Sheets

SYSTEM AND METHOD FOR RELOCATING BRANCH CIRCUIT ELECTRICAL CABLES FROM AN EXISTING ELECTRICAL ENCLOSURE

CROSS-REFERENCE TO RELATED APPLICATIONS

This application claims priority from U.S. Provisional Application Ser. No. 63/333,333 filed on Apr. 21, 2022, the entire disclosure of which is hereby incorporated herein by reference.

FIELD OF THE INVENTION

The present invention relates to electrical cabling, routing and electrical enclosures, and more particularly to the relocation of existing branch circuit electrical cables which originate within electrical enclosures.

BACKGROUND OF THE INVENTION

Electricity load centers are commonly deployed to distribute electricity and are the central location for electricity distribution to electrical branch circuits. Load centers exist within electrical enclosures. Branch circuits are electrical circuits which distribute electricity to end uses and which require overcurrent protection. Load centers receive electricity from a source either within the building or without. For example, a typical single-family home will have a single load center which receives external electricity from an electric utility. This electricity is typically delivered as single-phase alternating current (AC) electricity, most often over two "hot" wires, where each hot wire carries 120 volts AC (VAC), and which can be combined to deliver 240 VAC. In addition to the two hot wires is a neutral wire. Utility supplied electricity usually passes through an electric meter prior to any use. The output of the electric meter then typically enters the load center through its enclosure, often passing through a main breaker within the enclosure which provides overcurrent protection for the entirety of the utility-supplied electricity.

A typical residential load center will contain two hot bus bars, which provide connection points for multiple branch circuit breakers, where each circuit breaker provides overcurrent protection at the maximum current the branch circuit is designed to safely deliver. Each hot bus bar provides 120 VAC separately from each of the hot wires from the utility in this example. A single pole branch circuit breaker will connect to either one of the hot bus bars, thereby delivering 120 VAC at a desired maximum current to that branch circuit. A double pole branch circuit breaker will connect to both hot bus bars, thereby delivering 240 VAC at a desired maximum current to that branch circuit. By combining single and double pole breakers at various maximum currents, a typical residential electrical system can deliver different electrical power levels to different branch circuits as needed.

Within a typical residential electrical system as described above, all branch circuits are served by AC electricity at either 120 VAC or 240 VAC. Power limitations of branch circuits are determined by the current delivered, as well as the choice of a single pole (120 VAC) or double pole (240 VAC) circuit breaker. Because available voltages are fixed at 120 VAC or 240 VAC, branch circuit electrical power capacities are determined by the current capacity of the connected circuit breaker. Common branch circuit breakers exist at current ratings of 15 amps (A), 20 A, 30 A, 40 A, and 50 A. Some residential electric vehicle (EV) chargers require double pole breakers rated at 80 A.

Branch circuit electrical cables must be sized according to the maximum current of its branch circuit breaker, as defined in the National Electrical Code (NEC) as well as any other requirements of the local authority which has jurisdiction over electrical system requirements (AHJ). Current limitations for branch circuit cables exist because of the heat generated due to the resistance of the electrical conductors within the cable itself. In accordance with the basic laws of electricity, the electrical power lost to the resistance of the conductors themselves is lost as heat generated within the conductors. It is this heat which must be limited to safe levels as determined by the NEC to ensure the integrity of the wire and cable insulation, as well as limiting the ability of the conductor-generated heat to directly cause a fire in other building components, appliances and materials. The heat lost to conductor resistance is a function of the resistance of the conductor and the current which travels through the conductor, and is independent of the voltage of the electricity. The general equation for conductor heat generated is $P_{CH}=I_C^2 * R_C$ where $I_C$ is the current carried by the conductor, $R_C$ is the resistance within the conductor and $P_{CH}$ is the power lost as conductor heat. There are other factors which must be considered, and which are detailed in the various electrical codes, but the general equation is sufficient to illustrate the importance of the current carried to branch circuit capacity, especially since the square of the current determines heat generated. The general equation also illustrates that conductor heat generated is independent of branch circuit voltage, such that a single pole branch circuit at 120 VAC and limited to 20 A capacity will generate as much heat within its conductors as a double pole branch circuit at 240 VAC which is also limited to 20 A. This is the case even though the electrical power delivered by the 240 VAC circuit is double the electrical power delivered by the 120 VAC circuit. The power delivered by a branch circuit (without accounting for resistive losses within the conductors and other minor factors) is determined by the general equation $P_{BC}=V_{BC} * I_{BC}$ where $V_{BC}$ is the voltage of the branch circuit, $I_{BC}$ is the current carried by the branch circuit and $P_{BC}$ is the electrical power delivered by the branch circuit. Applying the power equation above, the example single pole 120 VAC circuit at 20 amps would deliver approximately 2,400 watts (W), or 2.4 kilowatts (kW). The example 240 VAC double pole circuit at 20 amps would deliver approximately 4.8 kW.

The above clearly states that the electrical power delivered by a branch circuit cable to an electrical load is determined by the voltage and limited only by the current. Theoretically the example double pole branch circuit limited to 20 A could deliver 20 kW at 1,000 volts, or even 1,000 kW at 50,000 volts. In practice, modern branch circuit cables are limited by a rated voltage capacity, in addition to their maximum rated current capacity. Modern branch circuit cables in the United States are most commonly rated to carry 600 volts, and thus their power capacity is limited. However, the rated voltage of 600 V is substantially higher than the existing highest voltage (240 VAC) available in the typical residential electrical system illustrated above. Therefore, there is an opportunity to increase the electrical power delivered over existing branch circuit cables when the electricity is delivered at higher voltages than what is available within the typical residential electrical system.

An additional factor relating to residential utility-provided electrical service is the rated capacity of the service provided. The most common levels of utility-provided residential service are 100-amp service and 200-amp service. Although there are other service levels, 100 and 200 amps are discussed here. Residential utility-supplied electricity service most often provides split-phase 240 VAC, delivered as two combinable "hot legs" of 120 VAC which can be combined to deliver 240 VAC. When the electricity required for the operation of a residence is increased, an increased utility-provided electricity service may be required. Many older homes were wired with 100-amp 240 VAC service, which may need to be increased to 200-amp 240 VAC electrical service. Upgrading residential utility-provided electrical service typically requires an upgraded load center with a main breaker upgraded to 200 amps, and heavier gauge electricity delivery cables rated to carry the upgraded electrical service. The electric utility also may need to upgrade some of its equipment which delivers electricity to the electric meter. A utility-side upgrade may be as simple as upgrading to higher gauge cable to carry the increased current to the meter, if the local utility circuit and local utility transformer have available unused capacity. However, if the local utility circuit and utility transformer do not have the available capacity then the utility will have to upgrade the local circuit and/or transformer. These charges are often passed on to the upgrading customer, and can be significant.

As concern about climate change has increased, approaches to reducing the release of carbon dioxide (CO2) have become more widespread. One of the approaches to reducing CO2 is building electrification, including residential building electrification. Broadly speaking, electrification refers to replacing existing fossil fuel residential end uses by electricity-powered end uses. The most significant building fossil-fuel uses to be converted to electricity include building space heating, water heating, cooking and clothes drying. If an existing residence uses natural gas for space heating, water heating, cooking and clothes drying, then all of those uses will need to replace the energy delivered by the natural gas with energy delivered as electricity. This will greatly increase the electricity needed by each of these end uses. The sum of the existing electricity needed by the building and the added electricity required by each of these electrified end uses often substantially increases the total electricity needed by the building. Separately, one of the most expensive parts of residential electrification is increasing the electrical capacity of the branch circuit electrical cables delivering electricity to these electrified end uses.

Residential building electrification often also includes incorporating solar photovoltaic (PV) generation and battery electricity storage systems. While solar PV is a generator and not an electrical load, wiring solar PV into an existing load center can itself trigger the need for an electrical service upgrade and/or an electrical load center upgrade.

The electrification of passenger vehicle transportation is also expected to increase residential electrical demand, and therefore may require an increase to utility-provided electrical service. Although an EV can be charged using a standard 120 VAC 15-amp electrical outlet (level 1 EV charging), that charging is very slow, in some cases taking 24 hours or more to deliver a full charge. Most EV owners would prefer to have level 2 charging, which uses 240 VAC and anywhere from 20 amps to 80 amps for most residential level 2 chargers. Since EV charging is almost always an entirely new electrical load, adding the required double pole 20-80-amp breaker to an existing residential load center can often trigger an electrical panel upgrade and/or require an electrical service upgrade.

Separate from the additional electrical requirements of residential building electrification, many of the components of building electrification natively use direct current electricity. Solar PV panels generate DC electricity and all electrochemical batteries store DC electricity. Variable-speed-drive (VSD) motor appliances must also first convert building AC electricity to DC electricity before then powering their motors. The most notable VSD residential loads are advanced high-efficiency heat pumps. These heat pumps are used for space heating and cooling, water heating and clothes drying. VSD motors are also commonly seen in clothes washers as well as refrigerators.

A particular challenge exists for converting gas-powered appliances to electrical appliances. For example, a gas cooktop is often connected to a 120 VAC 20-amp branch circuit. The primary source of heat energy for cooking is natural gas, and electricity only provides supplementary services such as gas ignition and some electronics. When a gas cooktop is converted to an electric cooktop, the electric cooktop will require substantially more electricity to replace the heating energy previously delivered by natural gas. Most electric cooktops require a 240 VAC circuit at 40 or 50 amps. As described above, this installation may trigger the need for an electrical panel upgrade or an electrical service upgrade. In addition, the existing electrical cable which delivered 120 VAC at 20 amps cannot safely carry the required additional electricity, and a larger capacity electrical cable must be installed.

One solution to the electrification challenge would be to install a second branch circuit load center somewhat in proximity to the original residential load center. The separate load center could distribute direct current electricity as two "hot legs" of DC electricity, one at 285 VDC and the second at −285 VDC each powering a hot bus bar within the DC load center. Since the DC electricity is incompatible with the AC electricity of the original load center, the two electrical systems are kept separate, with any links requiring electrical isolation. For example, a rectifier could rectify AC electricity from the existing load center as long as that rectifier is also isolating. Because of this isolation of the DC electrical system, the electrical capacity of the DC system does not impact the capacity of the AC system. The electrical capacity of the additional, separate DC load center is in addition to the existing electrical capacity of the existing AC load center and the existing utility-supplied electrical service. Therefore, the electrical capacity of the entire building is increased (within the separate DC load center) without needing to increase the capacity of the AC load center. If sufficient electricity can be generated, stored and released by a DC coupled solar PV array and battery storage system which is coupled to the separate DC load center, and/or the AC electricity pulled from the utility-provided electricity service can be managed to avoid exceeding peak capacity, then the building can serve the required increased electricity needed for an electrified home without also increasing the utility-provided electrical service.

An additional benefit of a separate DC branch circuit electrical system is that increased voltage can be leveraged to deliver increased electrical power over existing branch circuit electrical cables. In the above example, an existing gas cooktop was (electrically) connected to a 120 VAC 20-amp circuit. This circuit delivers a maximum of 2,400 watts. As mentioned above, a typical electric cooktop requires (at least) a 240 VAC 40-amp circuit which delivers a maximum of 9,600 watts. However, a double pole DC-rated circuit breaker installed in a separate DC load center as described above could safely deliver 570 VDC at the same 20 amps, for a maximum power of 11,400 watts.

Certain existing requirements of electrical codes and the standard practices of routing branch circuit electrical cables within buildings create challenges to the above solution of connecting existing branch circuits to a separate and different electrically incompatible direct current load center which is within a separate and different electrical enclosure. The first challenge stems from the requirement that all branch circuit cable sheathing, whether non-metallic or metallic, be removed within approximately one inch of that cable entering an electrical enclosure such as an enclosure containing a load center. This exposes the constituent wires which are otherwise within the sheathed cable, whether those wires are insulated or not, such that they can be routed as desired within the enclosure. Note that this requirement also applies to branch circuit cables when they enter other types of electrical enclosures whether or not it encloses a load center.

A second challenge is that standard electrical cabling practices are such that excess connected branch circuit electrical cable is not coiled up or otherwise stored and available immediately outside of the load center or other electrical enclosure. If extra connected branch circuit cable for a particular branch circuit was coiled up and stored outside of the enclosure and close to where that branch circuit enters the load center enclosure, it might be possible to extract that branch circuit cable from the load center enclosure, also extracting the exposed constituent wires which were previously routed within the load center or other electrical enclosure, and use the coiled or otherwise stored and connected sheathed branch circuit cable length to safely relocate that branch circuit and its constituent wires to a separate electrical enclosure installed some distance away, providing the coiled and stored additional connected branch circuit cable length is sufficient to reach the separate enclosure while remaining fully sheathed. With the existing sheathed branch circuit cable able to reach the separate enclosure, the constituent wires can then be routed as desired within the enclosure. Unfortunately, it is rare for electrical installations to include coiled up or otherwise stored extra connected branch circuit cabling as described above.

A third challenge is related to the second, in that after branch circuit electrical cables exit an electrical enclosure such as a load center they often become incorporated into the structure of the building such that freeing up a sufficient length of installed branch circuit along its deployed length such that relocating that existing branch circuit cable to a separate and different enclosure may be infeasible without extensive and expensive construction to open the building structures containing the otherwise inaccessible branch circuit cables. One solution is to install a freestanding junction box, as is commonly known in the art, a short distance away from the existing enclosure. While this can be done in a manner which is electrically safe, it may not be practical if there are many different branch circuits which are desired to be moved from the existing enclosure to a separate, different enclosure. This need to relocate many different branch circuits may be common in a scenario such as is described above, where there may be many different branch circuits which are desired to be relocated from an existing load center enclosure to a separate and different enclosure containing a different and electrically incompatible load center.

A fourth challenge is that deployment of an existing, separate junction box as is common in the art may not allow for convenient subsequent relocation of additional branch circuit cables from the same existing enclosure to a previously deployed separate and different enclosure, as described above. One scenario where such deployment might be desirable stems from the above scenario where a separate different load center distributing direct current is deployed in addition to an existing alternating current load center. At the initial time of installation, it may be desired to move certain existing branch circuits from an existing AC load center enclosure to a newly deployed load center distributing DC electricity. This may be desirable for end use loads which can be directly connected to the branch circuit cable at the end use appliance (e.g., hard wired). However, AC electrical outlet receptacles are widespread within buildings, as are the commonly available AC appliances with common cords and plugs designed to connect to those receptacles. Since there are currently no commonly available DC outlet receptacles and there are few commonly available branch circuit DC plug-in appliances requiring branch circuit power levels, given a current deployment of a separate, different DC load center, it may be desirable to not transfer branch circuit cables currently distributing AC electricity to existing building AC outlet receptacles. However, it can be envisioned that over time DC outlet receptacles become not only available but widespread. It can also be envisioned that over time DC-compatible appliances which require branch circuit voltages may also become available and widespread with different DC compatible plugs for DC branch circuit outlet receptacles. At such a time it may be desired to move additional AC branch circuits from the existing legacy AC load center enclosure to the previously deployed separate and different DC load center enclosure. A new approach which would readily allow this subsequent and expanded branch circuit cable transfer using a previously deployed junction box or enclosure would be desirable.

Electrical enclosures, including enclosures housing electrical load centers, are commonly either surface mounted or flush mounted. The above identified scenarios and challenges exist similarly whether the enclosures in question are surface mounted or flush mounted.

Electrical enclosures, including enclosures housing electrical load centers are most often constructed of metal, such as formed sheet steel. Electrical enclosures may also be constructed of other materials, particularly non-conductive plastics. Although enclosures containing load centers are rarely constructed of materials other than steel in the United States, other international jurisdictions have either allowed plastic load centers in the past or may allow plastic load center enclosures now. The scenarios and challenges detailed above are similar without regard to the particular material of the enclosure.

SUMMARY OF THE INVENTION

The present invention provides an improved method of relocating electrical cables whose sheathing terminates upon entry to an electrical enclosure and where unused lengths of those cables are not present outside of the enclosure. The present invention creates a novel electrical enclosure, for which one use is as a junction box for electrical cables, adapted to provide an alternative to the existing point of entry into the existing electrical enclosure by providing a point of cable entry into the novel electrical enclosure through an angled cable entry surface adjacent to the original enclosure where two sides terminate (i.e. a corner) such that the electrical cable can be removed from the original electrical enclosure, and relocated through the angled cable entry surface of the novel enclosure without requiring additional length of sheathed cable. This novel electrical enclosure is designed such that it is installed adjacent to the existing electrical enclosure, and is also affixed to the original enclosure. Any sides of the novel enclosure which are not installed against the original enclosure are of sufficient material and construction that they are consistent with existing requirements for an electrical enclosure such as a junction box. The novel junction box is comprised of a main section and a removable cover. The novel junction box with its removable cover installed is protective of the electrical cables and junctions within as per the existing requirements for junction boxes. One side of the novel enclosure is installed against at least a portion of one side of the existing enclosure. This side of the novel enclosure has at least one opening within it which allows for any electrical features of the adjoined side panel of the existing enclosure such as additional cable entry holes to function as they would have without the novel enclosure installed. The other sides of the novel enclosure serve to complete the enclosure, except for the removable cover, and provide cable entry points as is common on existing junction boxes. All sides of the novel enclosure terminate at a rear panel where that rear panel also extends flat against at least part of the rear panel of the original enclosure. This rear panel extension behind the original enclosure provides additional opportunity to secure the novel enclosure to the existing enclosure.

If there are existing cables exiting this side of the existing enclosure they would enter the novel junction box through the opening within the abutting side panel of the novel junction box, and can then either be joined to a new electrical cable for relocation away from the assembly of existing and novel enclosures, or can be routed through and can exit the novel enclosure unmodified through a different panel of the novel enclosure.

A preferred embodiment of the present invention is useful when the existing electrical enclosure also serves as an electrical load center, as commonly known in the art. Load centers often have many branch circuit cables leaving the load center to serve electricity to various branch circuits. These branch circuit cables often exit primarily from one side of the load center enclosure, for example the top side of the enclosure. These branch circuit cables also are incorporated into the building shortly after they exit the enclosure, leaving little extra length of sheathed branch circuit cable available. In this preferred embodiment of the present invention the angled surface is the surface of an angled side of the novel enclosure which starts where the top and one side of the load center enclosure meet. The angled surface of the angled side panel contains cable entry points as are common in the art of electrical enclosures, and extends from the corner where the top side of the load center enclosure meets the right side of the load center, as viewed from the front. The novel enclosure is adjacent to an existing electrical enclosure which the cable already enters, to a new electrical enclosure without requiring any substantial increased length of sheathed electrical cable outside of either enclosure.

Further areas of applicability of the present invention will become apparent from the detailed description provided hereinafter. It should be understood that the detailed description and specific examples, while indicating a preferred embodiment of the invention, are intended for purposes of illustration only and are not intended to limit the scope of the invention.

BRIEF DESCRIPTION OF THE DRAWINGS

The accompanying drawing figures, which are incorporated in and form a part of the specification, are illustrative of aspects of the present invention which will become more fully understood together with the following detailed description and are not meant to limit the scope of the disclosure in any manner, which scope shall be based on the claims. The present invention will become more fully understood from the detailed description and the accompanying drawings, wherein:

DETAILED DESCRIPTION OF THE INVENTION

Figure 1:
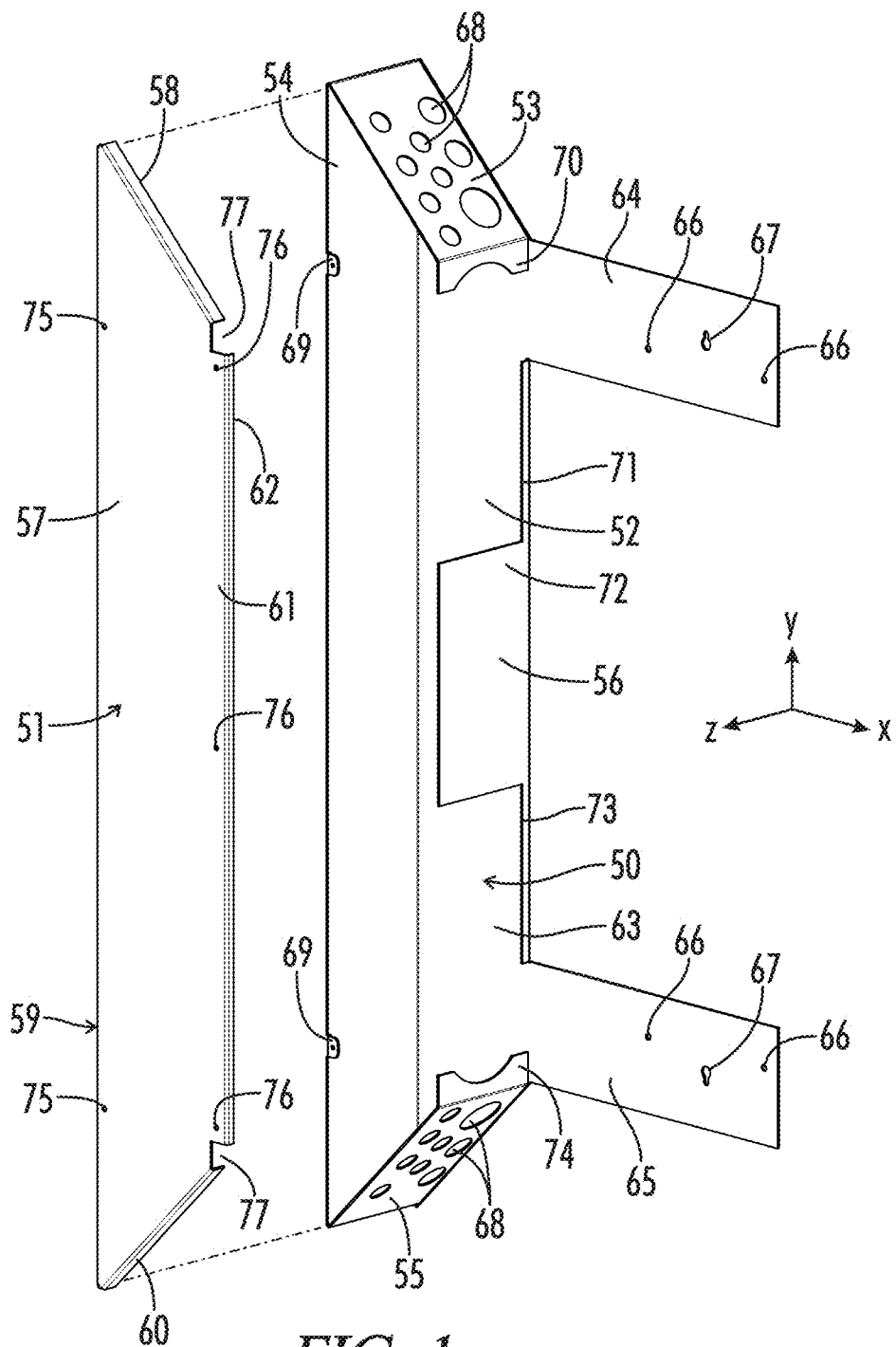
FIG. 1 is a three-dimensional perspective front view with minor elevation and rotation of a first embodiment of the present invention with components separated.

Reference will now be made in detail to embodiments of the present invention, examples of which are illustrated in the accompanying drawings. While the present invention will be described in conjunction with the several embodiment(s), the description is not intended to be understood in a limiting sense, but to be an example of the invention presented solely for illustration thereof, and by reference to which in connection with the following description and the accompanying drawings one skilled in the art may be advised of the advantages and benefits of the invention. On the contrary, the present invention is intended to cover alternatives, modifications, and equivalents, which may be included within the spirit and scope of the invention as defined by the appended claims. Further, it will be appreciated that embodiments of the present disclosure may employ any combination of features described herein. Descriptions of well-known starting materials, equipment, components, and processing techniques may be omitted so as to not unnecessarily obscure the embodiments herein.

Reference herein to a "first embodiment", "second embodiment", "an embodiment", "another embodiment" and like terms means that a particular feature, structure, or characteristic described in connection with the embodiment is included in at least one embodiment of the disclosure. The phrases "in an embodiment" or "in one embodiment" as used herein are not necessarily all referring to the same embodiment, nor are separate or alternative embodiments mutually exclusive of other embodiments. Moreover, various features are described that may be exhibited by some embodiments and not by others. Similarly, various requirements are described that may be requirements for some embodiments but not others.

The terms "comprising," "including" and "having," and their derivatives, are used to mean inclusion without limitation and are intended to be open-ended terms that specify the presence of the stated features, elements, components, groups, and/or steps, but do not exclude the presence of other unstated features, elements, components, groups, and/or steps and mean that there may be additional features, elements, components, groups, and/or steps other than those listed. As used herein, the terms "connected," "coupled," or any variant thereof, means any connection or coupling, either direct or indirect, between two or more elements. Additionally, the words "herein," "above," "below," and words of similar import, when used in this document, shall refer to this document as a whole and not to any particular portions of this application. If the specification states a component or feature "may," "can," "could," or "might" be included or have a characteristic, that particular component or feature is not required to be included or have the characteristic.

The articles "a," "an," "the" and "said" are intended to mean that there are one or more of the elements, unless stated otherwise. Unless defined otherwise, all technical and scientific terms used herein have the same meanings as commonly understood by one of ordinary skill in the art. When used in this document, the term "exemplary" is intended to mean "by way of example" and is not intended to indicate that a particular exemplary item is preferred or required. When terms such as "first" and "second" are used herein to modify a noun, such use is simply intended to distinguish one item from another, and is not intended to require a sequential order unless specifically stated. For orientation purposes, it will be understood that where embodiments of the invention are described herein with reference to the Figures using terms such as "top", "bottom", "front", "rear", "above", "below" and other terms of orientation, such terms are made for convenience and refer specifically to the orientation of the embodiments as they are oriented in the Figures, and as the invention would be normally utilized, and should not be construed in any other limiting manner.

The term "or" is inclusive, meaning and/or; the phrases "associated with and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

FIGS. 1 to 13B illustrate various embodiments of the present invention, with FIGS. 1-7 illustrating a first exemplary embodiment. Referring now in particular to FIGS. 1, 2A, and 2B, two novel components of a first embodiment of the present invention are illustrated. A third non-novel existing electrical enclosure component to which in use the novel components are joined is illustrated in FIGS. 3A and 3B. FIG. 1 illustrates an enclosure structural core 50 and an enclosure cover 51. FIG. 2A presents a 3D perspective front angled view of structural core 50 with cover 51 installed. FIG. 2B presents a 3D perspective view of structural core 50 and cover 51 separated but otherwise oriented similarly to FIG. 2A. Structural core 50 and cover 51 are displayed in a three dimensional "exploded view", such that the two novel components are separated giving a better view of the particular features of each. This exploded three-dimensional view is rotated slightly within the xy plane such that a partial front and side view can be seen. Structural core 50 comprises a rear panel 52, an angled top side panel 53, a long outer side panel 54, an angled bottom side panel 55, a discontinuous inner short side panel 56, and a front opening. Cover 51 comprises a front facing cover panel 57, an angled upper overhang lip 58, a long side overlap lip 59 which is not visible in FIG. 1, but whose location is indicated, an angled lower overhang lip 60, an extended cover portion 61 of front facing cover panel 57, and a short side extended overhang lip 62. Within this first embodiment of the present invention, both structural core 50 and cover 51 are made from sheet steel, using methods which are common and known in the art of creating electrical enclosures from sheet steel.

Rear panel 52 of structural core 50, as illustrated in FIG. 1, has the following additional features within this first embodiment of the present invention. Rear panel 52 has three portions. Main portion 63 of rear panel 52 is bordered by or concurrent with top, bottom, and side panels 53, 54, 55 and discontinuous side panel 56. Rear panel 52 also has two additional extension portions, 64 and 65, each of which extends from main portion 63 beyond a continuous plane which contains all portions of discontinuous side panel 56. Extension portion 64 of rear panel 52 is coplanar with main portion 63 and extension portion 65 of rear panel 52, and contains two non-threaded holes 66. Holes 66 are positioned such that they line up with existing holes within the third non-novel component of the present invention, and serve as a means of securing the present invention to the third component of this first embodiment of the present invention. Keyed hole 67 within portion 64 of rear panel 52 is a non-threaded keyed hole which is positioned such that it also lines up with a corresponding keyed hole within the existing third component of the present invention. Portion 65 of rear panel 52 also contains two non-threaded holes 66, which similarly line up with corresponding holes within the third existing component of this embodiment of the present invention, as well as a similarly corresponding keyed hole 67.

Discontinuous short side panel 56 comprises several different portions as illustrated in FIG. 1 of this first embodiment of the present invention. All portions of side 56 are coplanar, and include an uppermost end portion 70, a center portion 72, slim or narrow portions 71 and 73, and a lowermost end portion 74. Angled top panel 53 extends from the top edge of uppermost portion 70 of discontinuous short side panel 56 to where top panel 53 terminates and long side panel 54 begins. Angled top panel 53 also meets main portion 63 of rear panel 52. Angled top panel 53 meets the indicated portions of the three panels 52, 54 and 56 in a manner that is consistent with known standards and practices for metal electrical enclosures. Angled top panel 53 also contains multiple electrical cable entry holes 68. Holes 68, upon manufacture of core structure 52, still contain the original sheet metal of panel 53, and function as knockouts, which can be selectively removed where and when desired to facilitate electrical cable entry. The arrangement and operation of cable entry holes 68 and knockouts are similar to the common state of the art for cable entry holes and knockouts within existing electrical enclosures.

Long side panel 54, as illustrated in FIG. 1 of this first embodiment of the present invention, extends from the upper angled end of angled top panel 53 to where it terminates at the lower angled end of angled bottom panel 55. Side panel 54 also meets main portion 63 of rear panel 52. Long side panel 54 meets the indicated portions of the three panels 52, 53 and 55 in a manner that is consistent with known standards and practices for metal electrical enclosures. Long side panel 54 also contains two cover securing tabs 69. Tabs 69 begin where they meet the outermost edge of side panel 54, where the outermost edge runs the length of side panel 54 which is at the most distant from where side panel 54 meets rear panel 52, and extends within the xy plane, which plane is also parallel to rear panel 52, a short distance sufficient to include a threaded hole in the tabs 69. The threaded hole within each of the two cover securing tabs 69 is such that a common threaded fastener passed through two corresponding non-threaded holes within cover 51 are able to secure cover 51 in place using existing methods of fastener and thread design. Cover securing tabs 69 may consist of additional material, such as sheet steel, which forms long side panel 54, and can be sized, shaped and bent into place using existing methods known in the art to form tabs 69.

Angled bottom panel 55 extends from the lowest edge of long side panel 54 and proceeds at an angle to where it terminates at the bottommost edge 74 of discontinuous side panel 56. Angled bottom side panel 55 also meets main portion 63 of rear panel 52. Angled bottom panel 55 meets the indicated portions of the three panels 52, 54 and 56 in a manner that is consistent with known standards and practices for metal electrical enclosures. Angled bottom panel 55 also contains multiple electrical cable entry holes 68. Holes 68, upon manufacture of core structure 52, still contain the original sheet metal of panel 55, and function as knockouts, which can be selectively removed where and when desired to facilitate electrical cable entry. The arrangement and operation of cable entry holes and knockouts are similar to the common state of the art for cable entry holes and knockouts within existing electrical enclosures.

Uppermost portion 70 of discontinuous side panel 56 travels a short distance from the edge of angled top panel 53 closest to portion 64 of rear panel 52 and terminates a short distance in a curve as illustrated in FIG. 1. This curve is designed to allow a large diameter cable entrance hole within the portion of the side panel of the existing electrical enclosure against which discontinuous side panel 56 will rest, such that the large cable entry hole retains its ability to function as it could before a core structure 50 was installed against an existing electrical enclosure. Discontinuous short side panel 56 is discontinuous from the bottom curve of uppermost portion 70 across rear panel 52 until slim portion 71 begins at the intersection of the lowest edge of extension portion 64 of rear panel 52 with main portion 63 of rear panel 52. Slim portion 71 extends a short distance orthogonally from rear panel 52 in the same plane as all of the portions of short side panel 56, and parallel to the plane containing long side panel 54. The short distance allows existing cable entry holes in an existing electrical enclosure to which core structure 50 will be attached to retain functionality. Slim portion 71 of short side panel 56 terminates where full height or center portion 72 of side panel 56 begins. Portion 72 extends to the same distance from rear panel 52 as do side panels 53, 54 and 55. Portion 72 can be full height because the portion of the existing enclosure against which full height portion 72 abuts contains no cable entry holes or other features whose function would be otherwise lost. Full height portion 72 of side panel 56 terminates where slim portion 73 begins. Slim portion 73 extends a short distance from the main portion 63 of rear panel 52 to preserve function of cable entry holes within the abutting portion of the side of the existing electrical enclosure against which portion 73 of short side panel 56 of core structure 50 will be installed. Side panel 56 is discontinuous from the lowest termination of slim portion 73 where it intersects the highest edge of extension portion 65 of rear panel 52 until lowermost portion 74 of side panel 56 begins with a curve similar in function to the curve of uppermost portion 70 of side panel 56.

Referring now in particular to enclosure cover 51 as illustrated in FIG. 1 of this first embodiment of the present invention, as indicated above cover 51 comprises front cover panel 57, angled upper overhang lip 58, long side overhang lip 59 (whose location is noted in FIG. 1, but which is not directly visible), angled lower overhang lip 60, extended cover portion 61 and extended overhang lip 62. Angled upper overhang lip 58 is a lip of the same sheet steel as front panel 57, which extends a short distance from the upper angled edge of front panel 57 behind front panel 57, in a plane which includes the upper edge of front panel 57 and is orthogonal to front panel 57. The lip 58 is such that when cover 51 is installed on core structure 50 lip 58 also covers a short portion of angled top panel 53 of core 50, that which is furthest or distal from rear panel 52. Lip 58 coverage of a short distal portion of angled top panel 53 does not interfere in the operation of cable entry holes 68. The short distal portion of angled top panel 53 which is covered by lip 58 when cover 51 is installed on structural core 50 spans the entire length of angled top panel 53 from topmost edge of uppermost portion 70 of discontinuous panel 56 to where angled top panel 53 terminates at the topmost edge of long side panel 54. Similarly, long side overhang lip 59 has the same shallow depth as lip 58 from front cover panel 57 and extends from the termination of angled upper overhang lip 58 at the topmost edge of long side 54 along the entire length of the far left or outer long edge of front panel 57 of cover 51 until it terminates at the very bottom of the left edge of front panel 57. Similarly, angled lower lip overhang 60 has the same shallow depth as lips 58 and 59 from front cover panel 57 and extends from the termination of long side overhang lip 59 at the very bottom of the left edge of front panel 57 along the entire length of angled bottom panel 55 when cover 51 is installed onto a core 50 and lip 60 terminates where angled bottom panel 55 terminates at the very bottom of lowermost portion 74 of discontinuous short side panel 56. The three cover 51 overhang lips 58, 59 and 60 together form a single continuous lip over the portions of the three core 50 panels 53, 54 and 55 such that the lip is continuous from where panel 53 meets portion 70 of discontinuous side 56 and continues until it terminates where panel 55 meets portion 74 of discontinuous side 56. Extended cover portion 61 and extended overhang lip 62 are adapted to fit to an existing electrical enclosure to which core structure 50 and cover 51 are to be attached. Extended cover portion 61 is coplanar with front cover panel 57 and extends a short distance past discontinuous short side panel 56 in a direction orthogonal to the plane containing discontinuous short side panel 56 where extended overhang lip 62 is adapted to extend within a plane parallel to discontinuous side panel 56 over a portion of the existing enclosure to which structural core 50 and cover 51 are to be attached. Two non-threaded holes 75 through front cover panel 57 close to the top and bottom ends of lip 59 align with the corresponding threaded holes within the two cover securing tabs 69 along long side panel 54 of core 50. Two non-threaded holes within the top and bottom of extended cover portion 61 of cover 51 align with corresponding threaded holes within the existing enclosure portion to which core 50 and cover 51 will install. Spaces 77 at the top and bottom of the right side of cover 51 are the result of adapting extended cover portion 61 and extended overhang lip 62 to the existing enclosure to which core 50 and cover 51 will be attached. Three non-threaded holes 76 are located near the top, bottom and middle of extended cover portion 61 which align to threaded holes within the existing enclosure onto which structural core 50 and cover 51 are to be installed.

Figure 2A:
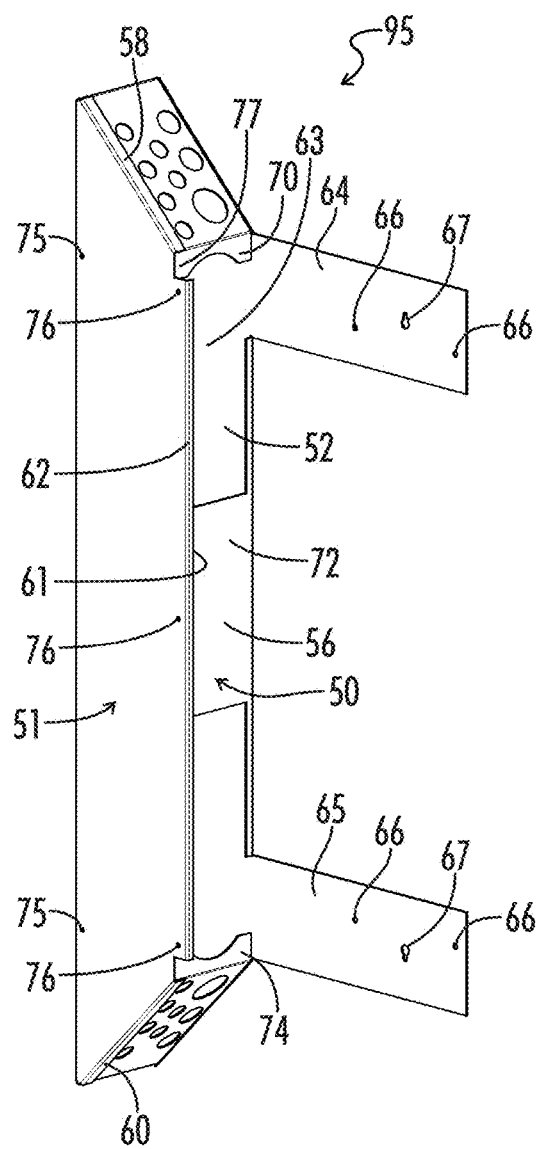
FIG. 2A is a three-dimensional perspective front view with minor elevation and rotation of a first embodiment of the present invention with components joined.
Figure 2B:
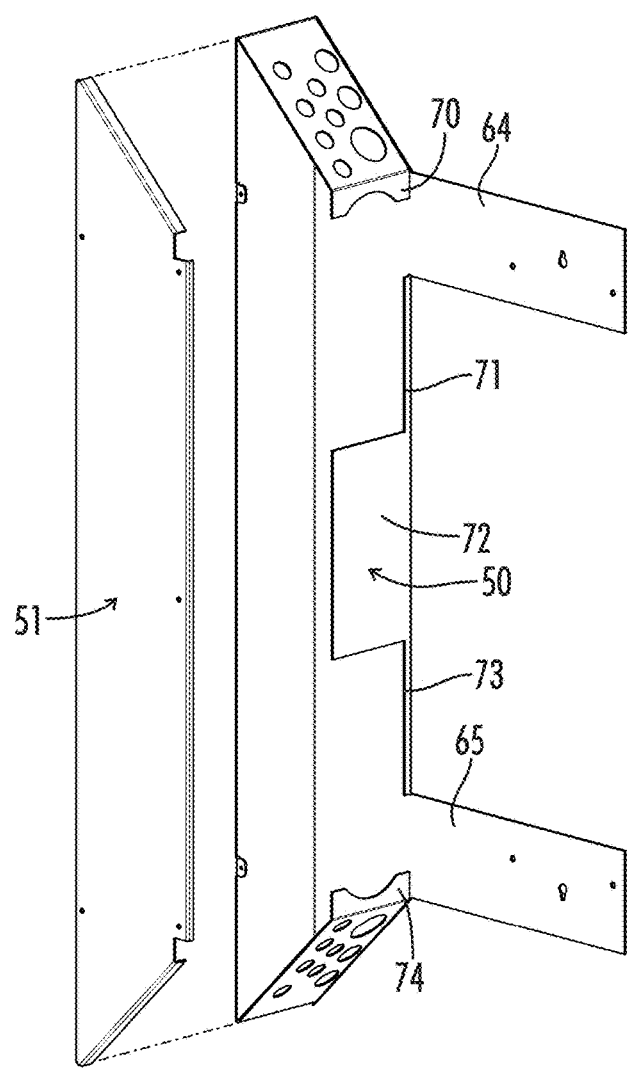
FIG. 2B is a three-dimensional perspective front view with minor elevation and rotation of a first embodiment of the present invention with components separated.

Referring now in particular to FIG. 2A, a three-dimensional perspective view is presented of an assembly of enclosure structural core 50 and cover 51 which forms an assembly of novel components 95. FIG. 2A provides a view of how structural core 50 and cover 51 fit together without inclusion of existing enclosure 78, to which assembly of novel components 95 will be attached. Assembly of novel components 95 as illustrated in FIG. 2A is not considered an electrical enclosure. This is due to discontinuous panel 56 having several openings of material size within its lengths, such as between panel slim portions 71 and 73 of panel 56 and lip 62 of cover 51. In FIG. 2B, a 3D perspective view of structural core 50 and cover 51 similar to the view in FIG. 1 is provided for reference.

Figure 3A:
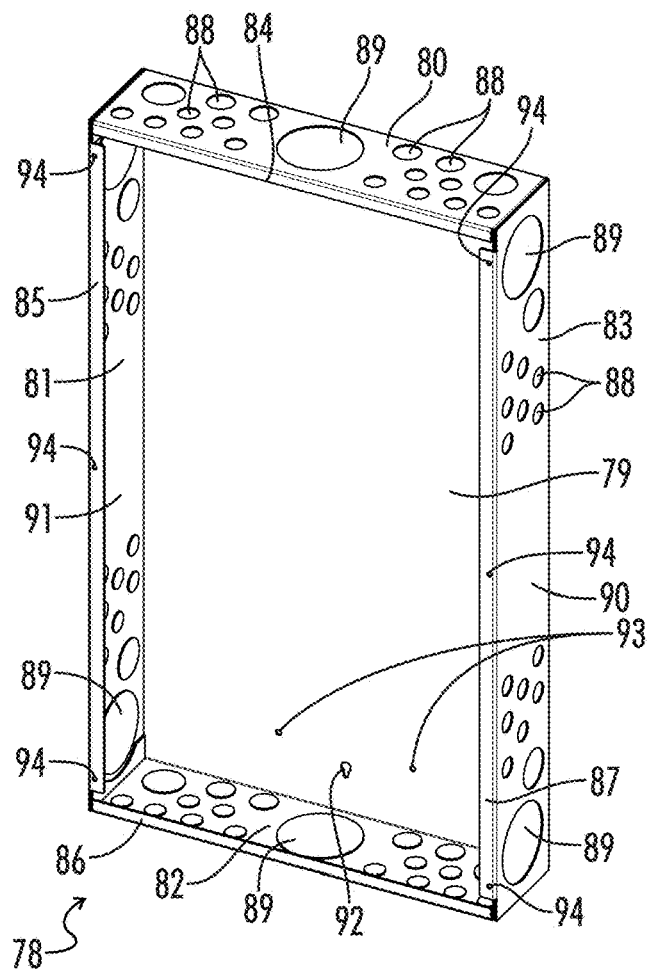
FIG. 3A is a three-dimensional perspective front view with minor elevation and rotation of an existing electrical enclosure.
Figure 3B:
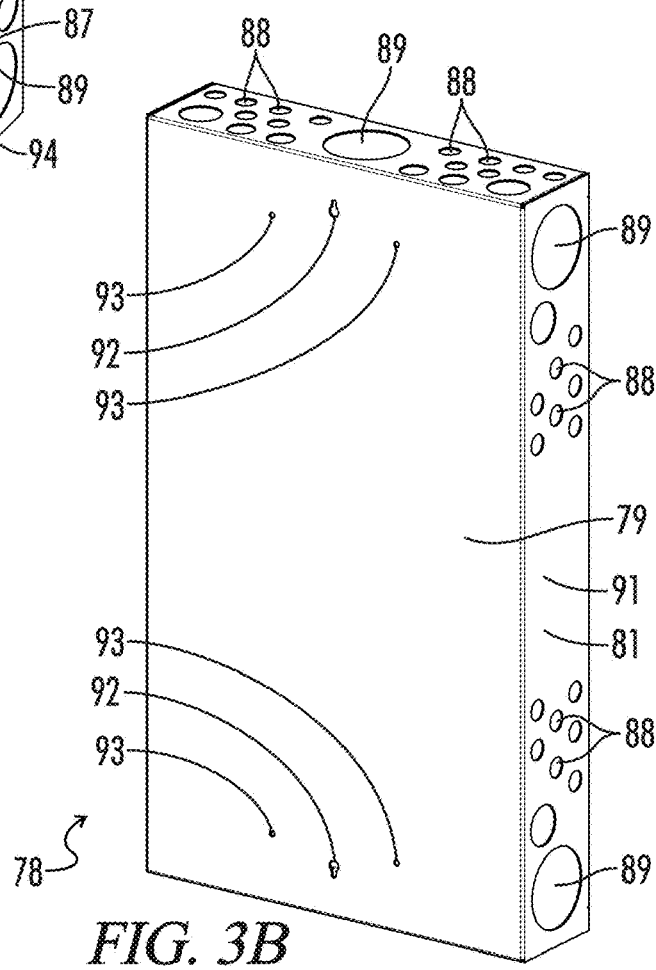
FIG. 3B is a three-dimensional perspective rear view with minor elevation and rotation of an existing electrical enclosure.

Referring now in particular to FIGS. 3A and 3B, FIG. 3A illustrates a 3D view front view of existing enclosure 78 where the front view is slightly rotated, and the view is elevated providing the perspective view as seen. FIG. 3B presents a different 3D view of existing enclosure 78 where it is rotated such that an angled view of the rear of enclosure 78 from a slight elevation is presented.

Existing enclosure 78 is an enclosure common in the electrical arts, and is a type of enclosure whose most common function is as an enclosure for an electricity load center, where that load center distributes electricity to branch electrical circuits as is known in the electrical arts. Although existing enclosure 78 is chosen for this first embodiment of the present invention, the invention may also be attached to other existing enclosures which serve a different known electrical purpose. Enclosure 78 comprises rear panel 79, a top cable entry panel 80, a side cable entry panel 81, a bottom cable entry panel 82, an opposite side cable entry panel 83, a narrow top cover seating panel 84, a narrow side cover seating panel 85, a narrow bottom cover seating panel 86 and a narrow side cover seating panel 87.

Referring now in particular to FIG. 3A, existing enclosure 78 is pictured such that side panel 81 is on the left of rear panel 79 and side panel 83 is on the right of real panel 79. Rear panel 79 is formed from sheet steel and extends continuously and terminates at the edge of top panel 80 which is farthest from narrow top seating cover panel 84. Rear panel 79 also extends continuously and terminates at the edge of side panel 81 which is farthest from narrow side cover seating panel 85. Rear panel 79 also extends continuously and terminates at the edge of bottom panel 82 which is farthest from narrow bottom cover seating panel 86. Rear panel 79 also extends continuously and terminates at the edge of side panel 83 which is farthest from narrow side seating panel 87. Top panel 80 and bottom panel 82 are each orthogonal to the plane containing rear panel 79 such that panels 80 and 82 are at right angles to rear panel 79. Panels 80 and 82 are also within parallel planes. Side panel 81 and side panel 83 each intersect rear panel 79 on opposite sides and extend from rear panel 79 in a plane which is orthogonal to rear panel 79. All four panels 80, 81, 82 and 83 of existing enclosure 78 extend the same distance from rear panel 79 as illustrated in FIG. 3A.

Narrow top cover seating panel 84 extends inwardly from the edge of top panel 80 farthest from rear panel 79 orthogonally a short distance towards bottom panel 82. Narrow panel 84 is in a parallel plane to that containing rear panel 79. Narrow side cover seating panel 85 extends inwardly from the edge of side panel 81 farthest from rear panel 79 orthogonally a short distance towards side panel 83. Narrow panel 85 is in a parallel plane to that containing rear panel 79. Narrow bottom cover seating panel 86 extends inwardly from the edge of bottom panel 82 farthest from rear panel 79 orthogonally a short distance towards top panel 80. Narrow panel 86 is in a parallel plane to that containing rear panel 79. Narrow side cover seating panel 87 extends inwardly from the edge of side panel 83 farthest from rear panel 79 orthogonally a short distance towards side panel 81. Narrow panel 87 is in a parallel plane to that containing rear panel 79. Narrow panels 84, 85, 86 and 87 all occupy a common plane. Narrow side cover seating panel 85 contains three threaded cover attachment holes 94, with one hole 94 located close to narrow panel 84, one located an equal distance between narrow panels 84 and 86, and a third located close to narrow panel 86. Narrow side cover seating panel 87 similarly contains three threaded cover attachment holes 94, with one hole 94 located close to narrow panel 84, one located an equal distance between narrow panels 84 and 86, and a third located close to narrow panel 86.

Top cable entry panel 80 extends from a ninety-degree intersection with side panel 81 to a ninety-degree intersection with side panel 83. Panel 80 contains one large cable entry hole 89 which is centrally located between side panels 81 and 83 as illustrated in FIG. 3A. An assortment of smaller cable entry holes 88 are on either side of large hole 89. Side cable entry panel 81 extends from a ninety-degree intersection with top panel 80 to a ninety-degree intersection with bottom panel 82. One large cable entry hole 89 is present near each ninety-degree intersection at either end of side panel 81. An assortment of smaller cable entry holes 88 within side panel 81 extend from each corner-proximate large cable entry hole 89 towards a featureless middle or center portion 91 of side panel 81 as illustrated in FIG. 3A. Bottom cable entry panel 82 extends from a ninety-degree intersection with side panel 81 to a ninety-degree intersection with side panel 83. Panel 82 contains one large cable entry hole 89 which is centrally located between side panels 81 and 83 as illustrated in FIG. 3A. An assortment of smaller cable entry holes 88 are on either side of large hole 89. Side cable entry panel 83 extends from a ninety-degree intersection with top panel 80 to a ninety-degree intersection with bottom panel 82. One large cable entry hole 89 is present near each ninety-degree intersection at either end of side panel 83. An assortment of smaller cable entry holes 88 within side panel 83 extends from each corner-proximate large cable entry hole 89 towards a featureless middle or center portion 90 of side panel 83 as illustrated in FIG. 3A.

Referring now in particular to FIG. 3B, a rear 3D perspective view of existing enclosure 78 is presented. Four non-threaded holes 93 are visible within rear panel 79. Two non-threaded holes 93 are located a similar distance from the middle of rear panel 79 and close to top cable entry panel 80. Two non-threaded holes 93 are similarly located the same distance from the middle of rear panel 79 and similarly close to the termination of rear panel 79 at bottom panel 82. Two keyed holes 92 within rear panel 79 are also visible. A first keyed hole 92 is located in rear panel 79 centered between side panels 81 and 83, and located a small distance closer to the termination of rear panel 79 at top panel 80 than are top holes 93. A second keyed hole is similarly located centered in rear panel 79 between side panels 81 and 83, and a small distance closer to the termination of rear panel 79 at bottom panel 82. All four non-threaded holes 93 in rear panel 79 of existing enclosure 78 align, by the design of structural core 50, with non-threaded holes 66 within both extension portions 64 and 65 of rear panel 52 of this first embodiment of the present invention. Similarly, both keyholes 92 within rear panel 79 of existing enclosure 78 align with both keyholes 67 within both extension portions 64 and 65 of rear panel 52 of structural core 50.

Figure 4A:
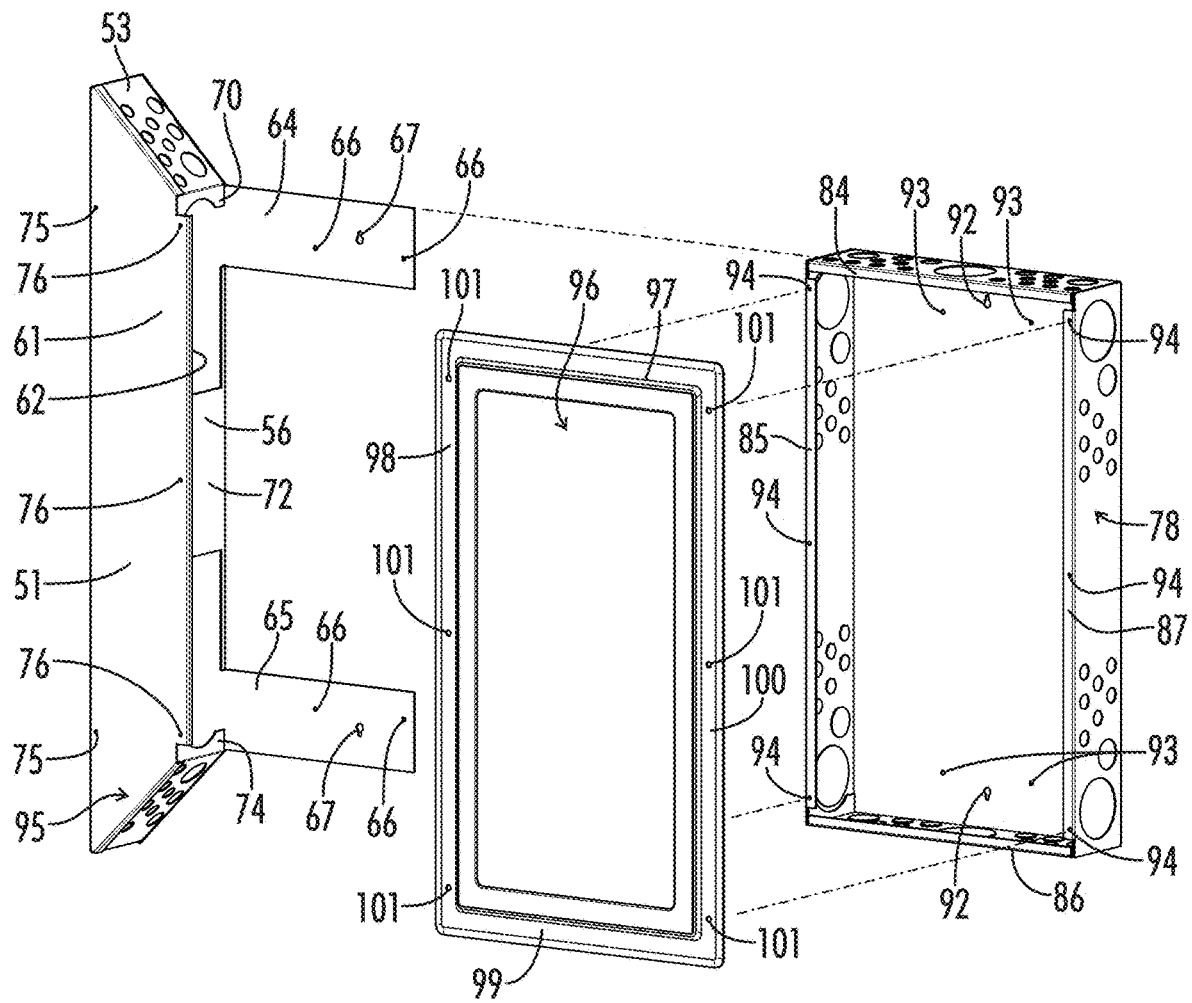
FIG. 4A is a three-dimensional perspective front view with minor elevation and rotation of a joined first embodiment of the present invention, an existing enclosure cover and an existing electrical enclosure where elements are separated.
Figure 4B:
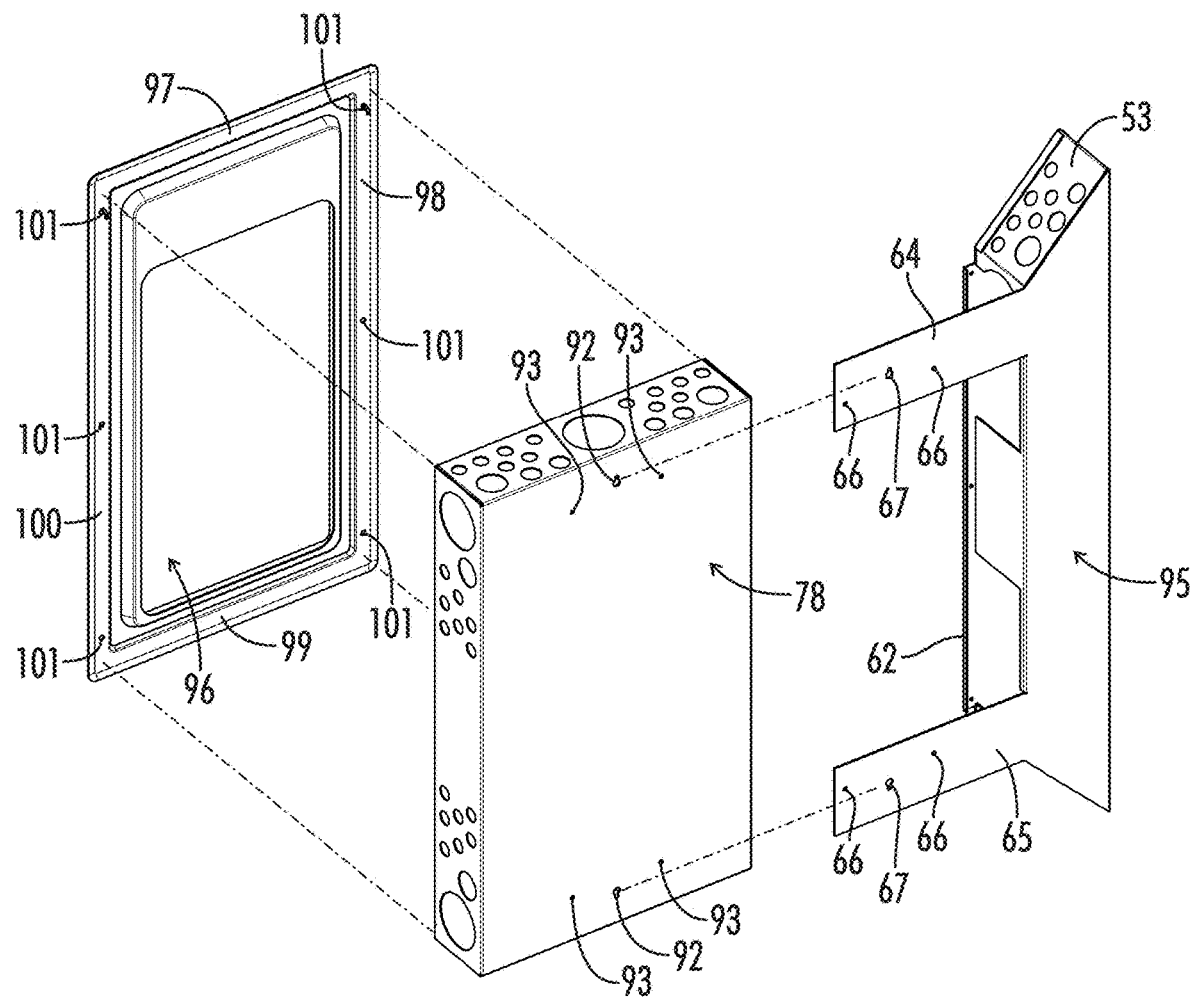
FIG. 4B is a three-dimensional perspective rear view with minor elevation and rotation of a joined first embodiment of the present invention, an existing enclosure cover and an existing electrical enclosure where elements are separated.

Referring now in particular to FIG. 4A, a three-dimensional view of assembly of novel components 95, existing enclosure 78, and existing cover assembly 96 is presented. Existing cover assembly 96 is a standard enclosure cover as is standard in the art of enclosure covers, particularly covers for existing enclosures which are adapted to be load centers in the standard of the existing art. As illustrated in FIG. 4A, cover assembly 96 is designed to be installed onto existing enclosure 78 such that the resulting combined assembly performs as a complete electrical load center as is commonly known in the art. Cover 96 includes four enclosure interface panels 97, 98, 99 and 100. These interface panels form a continuous coplanar rectangle close to the perimeter of cover assembly 96. Side interface panel 98 includes three non-threaded holes 101 which are designed to align with the three threaded holes within narrow side panel 85 of enclosure 78. Side interface panel 100 similarly contains three non-threaded holes 101 which are designed to align with the three threaded holes within narrow side panel 87 of enclosure 78. Top interface panel 97 of cover 96 abuts narrow top cover seating panel 84 of enclosure 78 when cover 96 is installed onto enclosure 78. Side interface panel 98 of cover 96 abuts narrow side cover seating panel 85 of enclosure 78 when cover 96 is installed onto enclosure 78. Bottom interface panel 99 of cover 96 abuts narrow bottom cover seating panel 86 of enclosure 78 when cover 96 is installed onto enclosure 78. Side interface panel 100 of cover 96 abuts narrow side cover seating panel 87 of enclosure 78 when cover 96 is installed onto enclosure 78.

Referring now in particular to FIG. B, a three-dimensional rear view of assembly of novel components 95, existing cover assembly 96 and existing enclosure 78 is presented.

Figure 5:
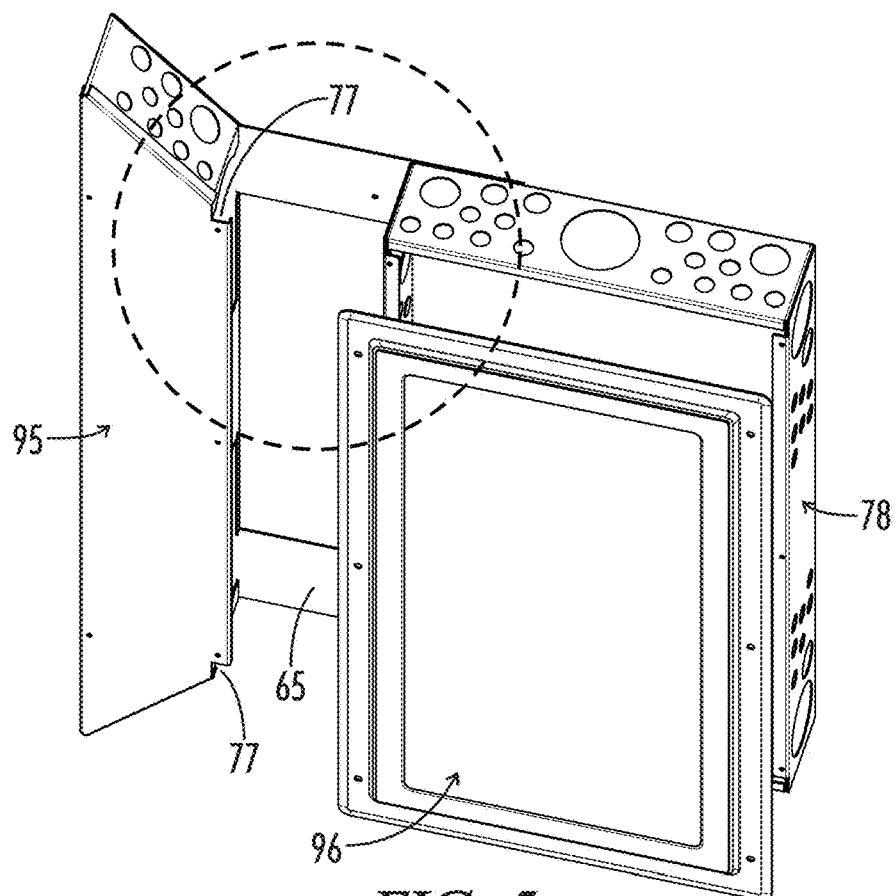
FIG. 5 is a three-dimensional perspective front view with minor elevation and rotation of a joined first embodiment of the present invention, an existing enclosure cover and an existing electrical enclosure where elements are separated, and a circled area is selected for magnification.
Figure 5A:
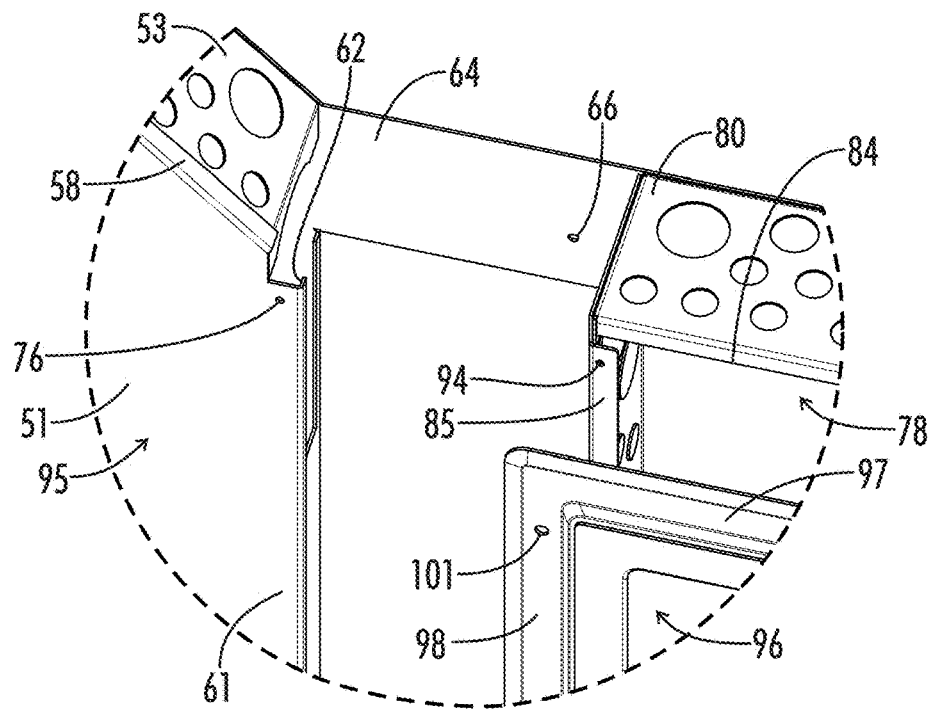
FIG. 5A is a magnification of the circled portion of FIG. 5.

Referring now in particular to FIGS. 5 and 5A, a three-dimensional perspective view is presented of assembly of novel components 95, existing enclosure 78 and existing cover assembly 96. FIG. 5A provides a magnified view of a section of the perspective view in FIG. 5. When novel assembly 95 is to be installed on an existing enclosure 78 cover 51 of assembly 95 must first be removed. This is due to extending cover portion 61 and extended overhang lip 62 of cover 51 of assembly 95. When installed to enclosure 78, extended overhang portion 61 of cover 51 extends beyond structural core 50 discontinuous panel 56 such that it abuts against narrow side panel 85 of existing enclosure 78. Extended overhang lip 62 begins at the edge of extended overhang portion 61 of cover 51 which is closest to opposite narrow side panel 87, and lip 62 is designed such that when assembly 95 is installed against enclosure 78 lip 62 extends from the edge of extended portion 61 past narrow panel 85 a short distance in a plane parallel to the plane containing side panel 81 of existing enclosure 78, thereby keeping cover 51 and assembly 95 secured to existing load center 78. Therefore, when installing an assembly 95 onto an enclosure 78 cover 51 must be removed from assembly 95, or at least lifted such that extended overhang lip 62 can pass narrow side panel 85. When lip 62 of lid 51 is past narrow panel 85 of enclosure 78, cover can be seated as designed against the three edges of structural core 50 panels 53, 54, 55 and also against narrow side cover seating panel 85 with lip 62 now in place and holding cover 51 in place against the edge of narrow panel 85. When cover 51 is in place and assembly 95 is in place against enclosure 78, the three threaded holes 94 within narrow panel 85 are aligned with the three non-threaded holes 76 within extended portion 61 of cover 51. Existing cover assembly 96 can now be installed onto novel assembly 95 and enclosure 78. Existing cover assembly 96 can now be put in place against enclosure 78 and extended portion 61 of cover 51. When in place the three non-threaded holes 101 within enclosure interface panel 98 will align with the three non-threaded holes 76 within extended portion 61 of cover 51 and will also align with the three threaded holes within narrow side panel 85 of enclosure 78. The three non-threaded holes within enclosure interface panel 100 also align with the three threaded holes within narrow panel 87 of enclosure 78. When six standard threaded fasteners are secured within all of the aforementioned holes and tightened, the assembly comprising novel assembly 95, enclosure 78 and cover assembly 96 is further reinforced.

Figure 6A:
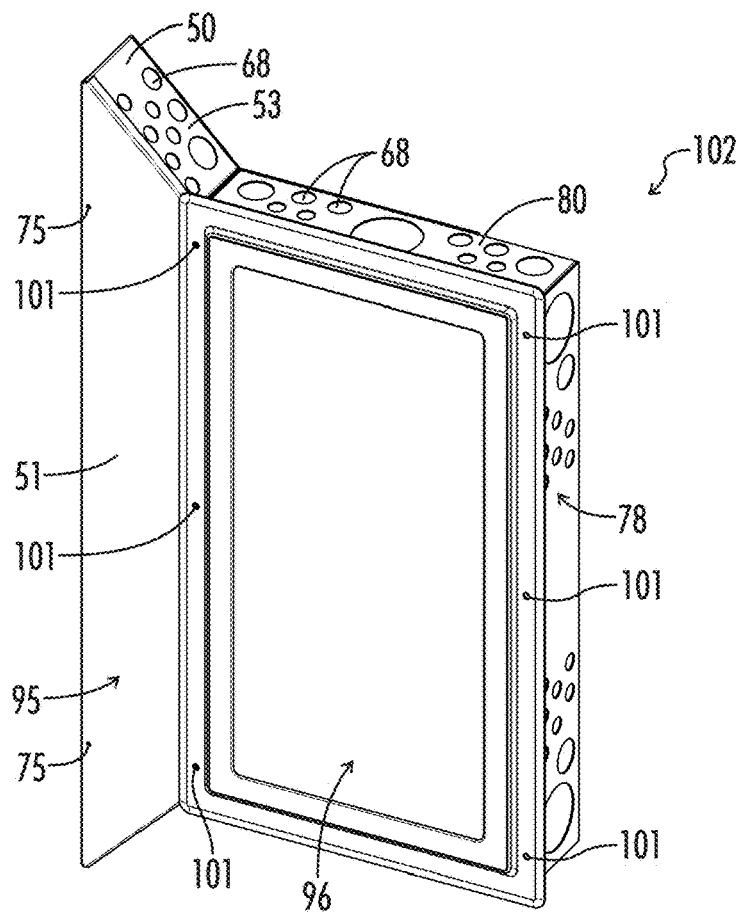
FIG. 6A is a three-dimensional perspective front view with minor elevation and rotation of a joined first embodiment of the present invention, an existing enclosure cover and an existing electrical enclosure where these elements are joined.
Figure 6B:
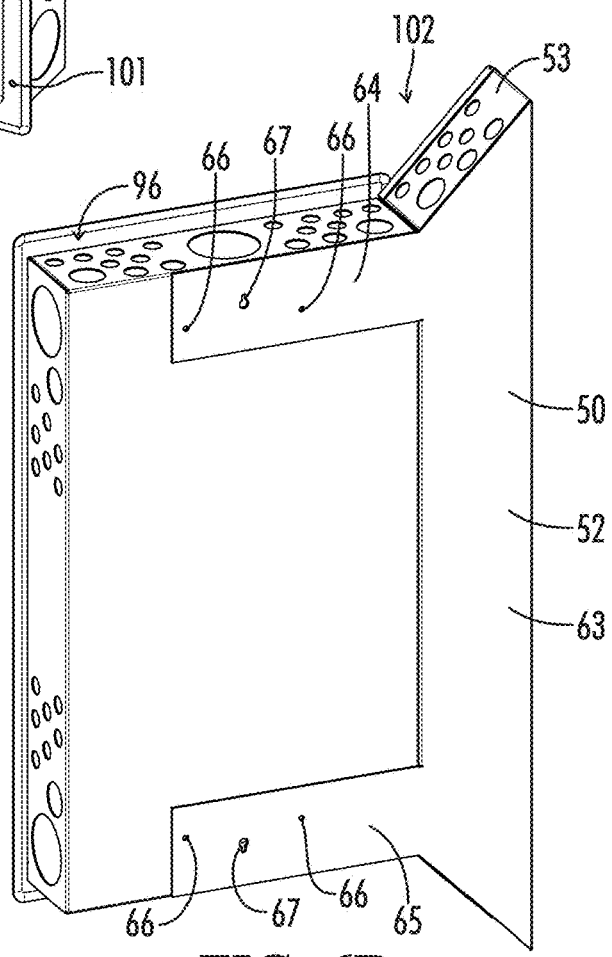
FIG. 6B is a three-dimensional perspective rear view with minor elevation and rotation of a joined first embodiment of the present invention, an existing enclosure cover and an existing electrical enclosure where these elements are joined.

Referring now to FIGS. 6A and 6B, two different three-dimensional perspective views are provided of full assembly 102. Full assembly 102 comprises assembly of novel components 95, existing enclosure 78 and existing cover assembly 96. Full assembly 102 is electrically secure, providing two separated electrical enclosures. With six threaded fasteners installed in six holes 101, the assembly is secured in place with both cover 51 and cover assembly 96 secured in place. The rear perspective view of full assembly 102 as seen in FIG. 6B illustrates that holes 66 within extension portions 64 and 65 of rear panel 52 can further reinforce the strength of full assembly 102. The four holes 66 within rear panel 52 align to the four holes 93 within rear panel 79 of enclosure 78. If full assembly 102 is to be installed onto a vertical surface, such as a sturdy piece of plywood, four wood screws or similar fasteners of sufficient strength could be driven through all four combinations of holes 93 and holes 66, providing additional structural strength to maintain the integrity of full assembly 102. If full assembly 102 is not to be surface mounted, then a common assembly of four bolts and four nuts can be secured through all four combinations of holes 66 and 93 to further reinforce full assembly 102.

Figure 7:
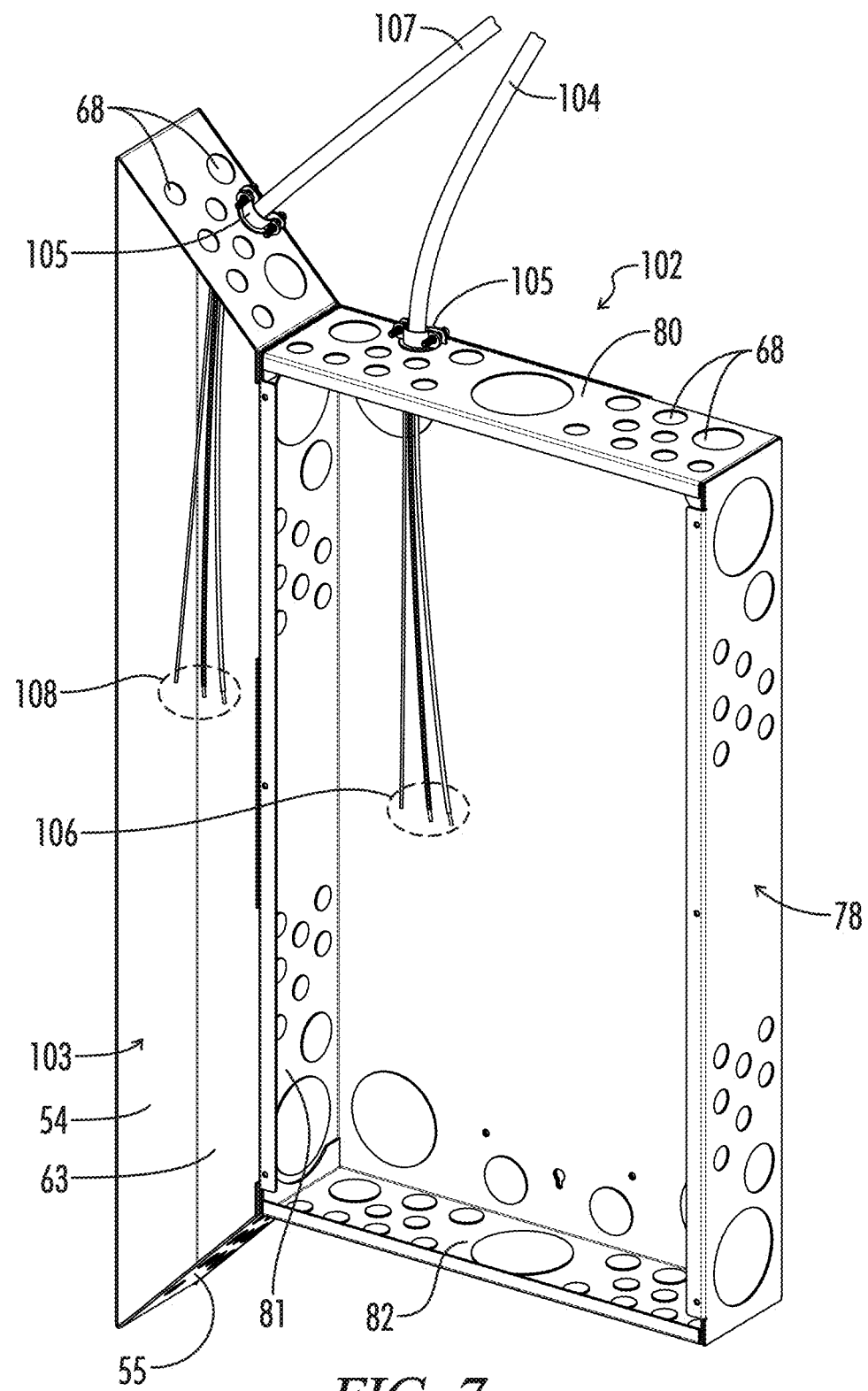
FIG. 7 is a three-dimensional perspective front view with minor elevation and rotation of a portion of a first embodiment of the present invention joined with an existing electrical enclosure where electrical cables are shown to enter each.

Referring now in particular to FIG. 7, a full assembly 102 is illustrated with both existing cover assembly 96 and novel cover 51 removed. Existing enclosure 78 is visible as is novel enclosure 103. Neither structural core 50 nor assembly of novel components 95 could alone be considered electrical enclosures due to the material sized discontinuities within short side panel 56. As illustrated in FIG. 7, core 50 is in place against existing enclosure 78 such that discontinuous panel 56 abuts against the continuous side panel 81 of enclosure 78 such that novel enclosure 103 can now be considered an enclosure. Branch circuit cable 104 is a portion of a fully sheathed non-metallic branch circuit cable as are commonly distributed throughout buildings. Branch circuit cable 104 terminates at common stress reliever 105, at which point the sheathing is removed from cable 104, and three constituent wires 106 extend unsheathed within enclosure 78. Branch circuit cable 104 travels from stress reliever 105 at top panel 80 of enclosure 78 to another location within a building and serves branch circuit electricity there. As is common in electrical practice, extra branch circuit length is not provided, and cable 104 proceeds directly to the nearest building structure such as a wall or ceiling, where it enters the structure enroute to its destination. Thus is the utility of the present invention, in that if it is desired to relocate a branch circuit cable from enclosure 78 to another separate enclosure, it could not be easily done using the existing sheathed cable. As illustrated in FIG. 7, a branch circuit cable such as cable 104 could be relocated to enter novel enclosure 103 as illustrated by branch circuit cable 107 which, due to the presence of angled cable entry panel 53, branch circuit cable 107 can enter enclosure 103 through a stress reliever 105 without requiring additional lengths of sheathed branch circuit cable. Once branch circuit cable 107 reaches a stress reliever 105 and passes into enclosure 103, its constituent wires 108 can be joined with a new branch circuit cable using wire junction methods standard in the art, and can exit enclosure 103 and be routed where desired.

Figure 8A:
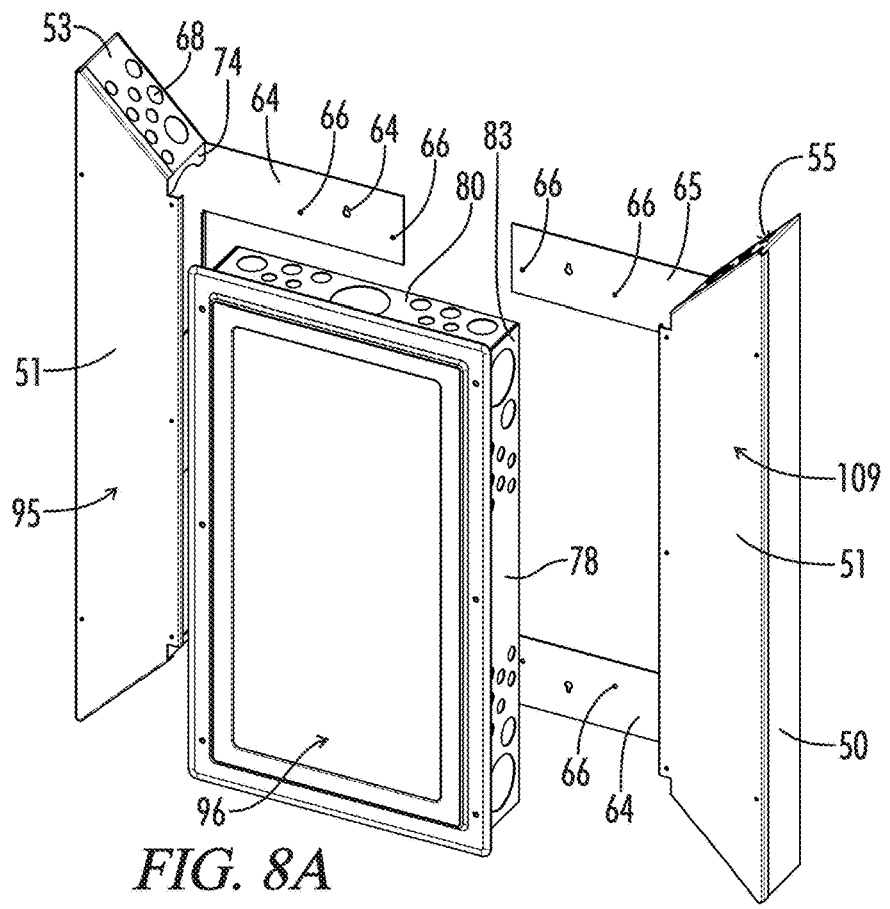
FIG. 8A is a three-dimensional perspective front view with minor elevation and rotation of a second embodiment of the present invention separated from a joined existing enclosure and existing cover.

FIGS. 8A-9B illustrate a second embodiment of the present invention. Referring now in particular to FIG. 8A, in this second embodiment, the same existing enclosure 78 and existing cover assembly 96 as in the first embodiment are employed, as is the same assembly of novel components 95, wherein the same structural core 50 and cover 51 are assembled. New in this second embodiment is a second assembly of novel components 109 which, while assembly 109 is identical in composition and components to assembly of novel components 95, it is differently employed in this second embodiment. Due to the symmetry of the components, the alignment and installation of a second assembly of novel components 109 is similar to the installation of assembly 95 to enclosure 78. If assembly 95 were to be rotated 180 degrees within the plane of cover 51 it would be positioned exactly as is assembly 109 as illustrated in FIG. 8A. Due to this rotation, angled panel 53 of assembly 95 will be adjacent to enclosure panel 80 when assembled, but enclosure panel 80 will be adjacent to angled panel 55 due to the 180-degree orientation of assembly 109. Apart from the panel orientation, this second embodiment of the present invention offers advantages in that there are two enclosures, and four angled cable entry panels, providing increased options and enclosure space for relocating additional branch circuit cables as illustrated above.

Figure 8B:
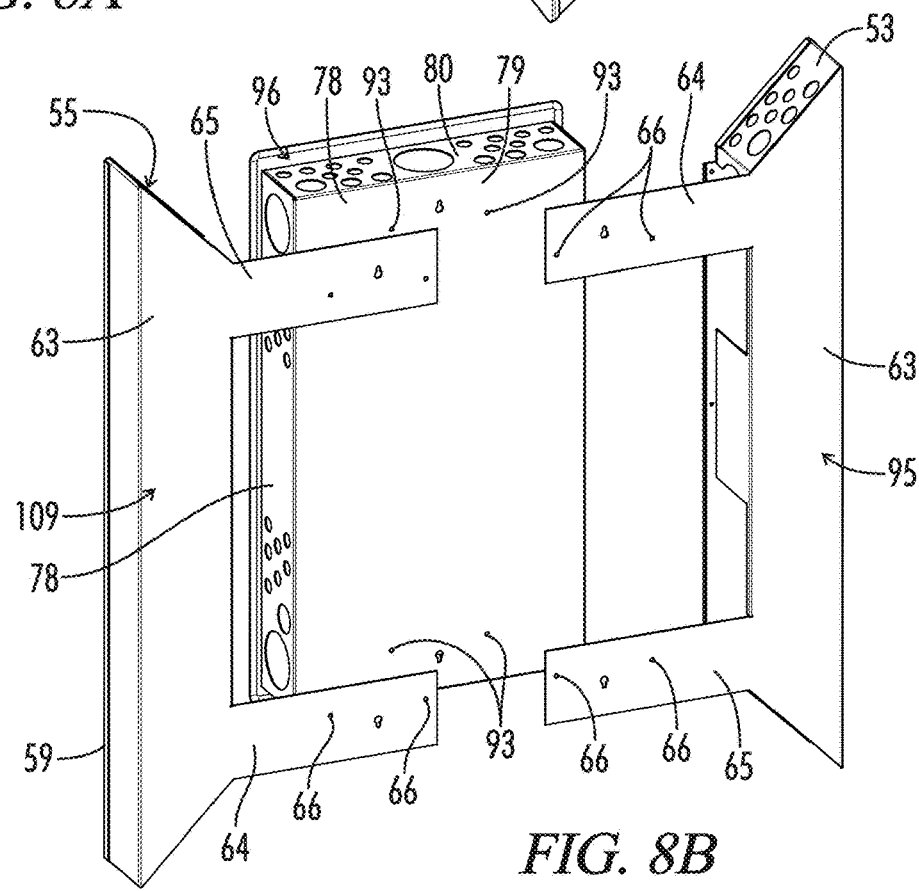
FIG. 8B is a three-dimensional perspective rear view with minor elevation and rotation of a second embodiment of the present invention separated from a joined existing enclosure and existing cover.

Referring now to FIG. 8B, a three-dimensional perspective rear view of the second embodiment of the present invention is provided. In the rear view presented in FIG. 8B, all three portions of rear panel 52 of both assemblies of novel components 95 and 109 are visible. Due to the rotated orientation of assembly 109, rear panel portion 64 of assembly 109 aligns with rear panel portion 65 of assembly 95, and rear panel portion 65 of assembly 109 aligns with rear panel portion 64 of assembly 95. In this second embodiment of the present invention, assembly 95 will be first installed onto existing enclosure 78 as described in the first embodiment. Both portions 64 and 65 of rear panel 52 abut directly against rear panel 79 of enclosure 78 such that all four non-threaded holes 66 align with all four non-threaded holes 93 within rear panel 52 of enclosure 78. Next, assembly 109 will be installed to the assembly of enclosure 78 and assembly 95. Rear panel portion 65 of assembly 109 installs directly onto rear panel portion 64 of assembly 95, and not directly onto rear panel 79 of enclosure 78. Rear panel portion 64 of assembly 109 installs directly onto rear panel portion 65 of assembly 95, and not directly onto rear panel 79 of enclosure 78. When both assemblies of novel components 95 and 109 are installed onto enclosure 78, all four holes 66 within rear panel portions 64 and 65 of assembly 109 align with all four holes 66 within panel portions 64 and 65 of assembly 95, and all 8 holes 66 within both assemblies of novel components 95 and 109 align with all four holes 93 within rear panel 79 of enclosure 78. Four threaded nut and bolt assemblies of sufficient strength could be fastened through all holes 66 and 93 and further strengthen the assembly.

Figure 9A:
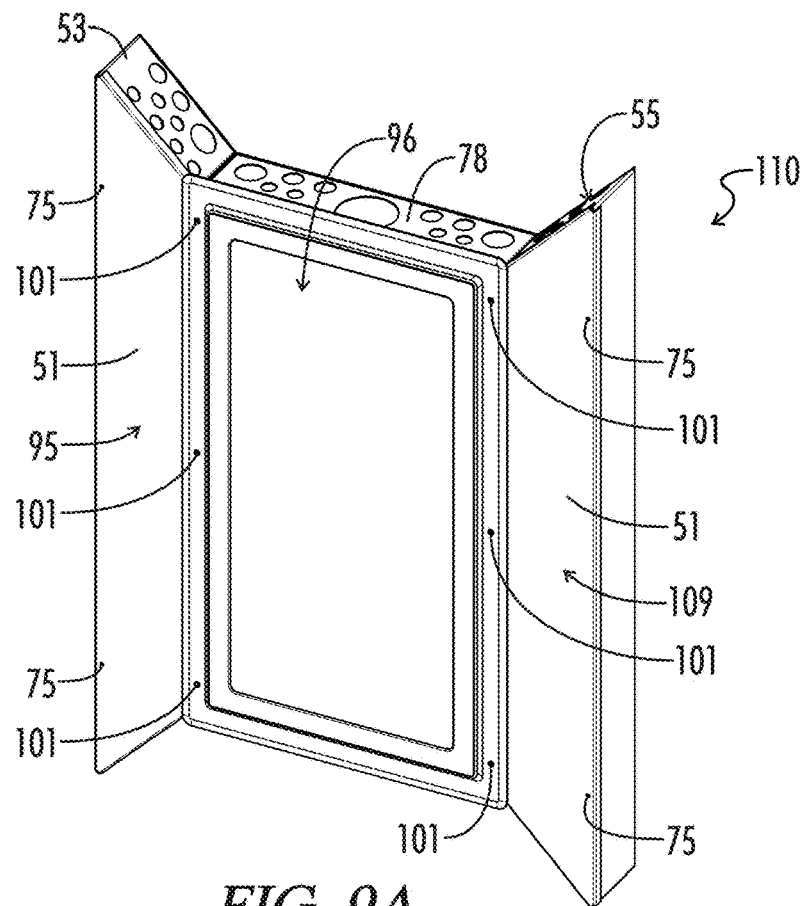
FIG. 9A is a three-dimensional perspective front view with minor elevation and rotation of a second embodiment of the present invention, an existing enclosure and an existing cover where all elements are joined.

Referring now to FIG. 9A, a three-dimensional perspective front view is presented of full assembly 110. Assembly 110 is the completed assembly for this second embodiment of the present invention. Assembly 110 comprises an existing enclosure 78 to which an assembly of novel components 95 and an assembly of novel components 109 have been installed as illustrated above, and an existing cover assembly 96 has also been installed. To secure assembly 110, suitable threaded fasteners are installed in all four holes 75 thereby securing both covers 51 to their respective assemblies 95 and 109, and six suitable fasteners are installed in holes 101 thereby securing both cover 96 and covers 51 to enclosure 78.

Figure 9B:
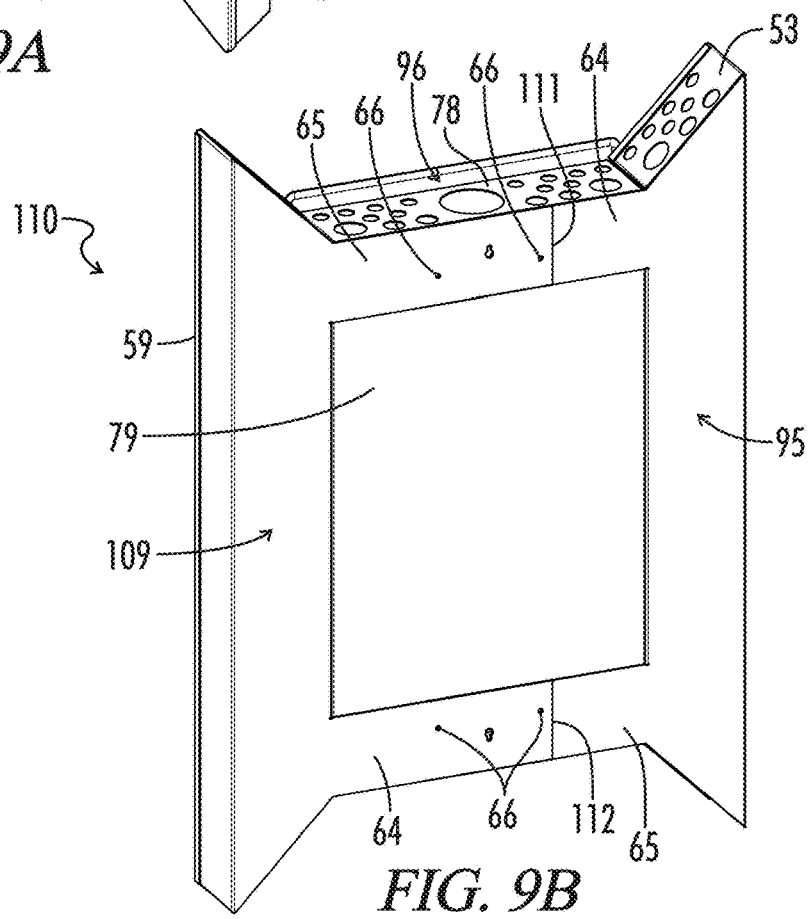
FIG. 9B is a three-dimensional perspective rear view with minor elevation and rotation of a second embodiment of the present invention, an existing enclosure and an existing cover where all elements are joined.

Referring now in particular to FIG. 9B of the present invention, a 3D perspective rear view of full assembly 110 is presented, where assembly 110 is the completed assembly for this second embodiment of the present invention. In this assembled rear view, the overlapping rear panel portions are visible, given the assembly sequence described above. Since assembly 95 was installed to enclosure 78 first, its rear panel portions 64 and 65 are partially obscured by the rear panel portions 64 and 65 of assembly 109. Line 111 demarcates where rear panel portion 65 of assembly 109 terminates, revealing the visible portion of rear panel portion 64 of assembly 95. Line 112 similarly demarcates where rear panel portion 64 of assembly 109 terminates, revealing the visible portion of rear panel portion 65 of assembly 95. Assembly 110 can be further secured with the installation of four suitable nut and bolt assemblies through holes 66 thereby securing all rear panel portions 64 and 65 to rear panel 79 of enclosure 78.

Figure 10:
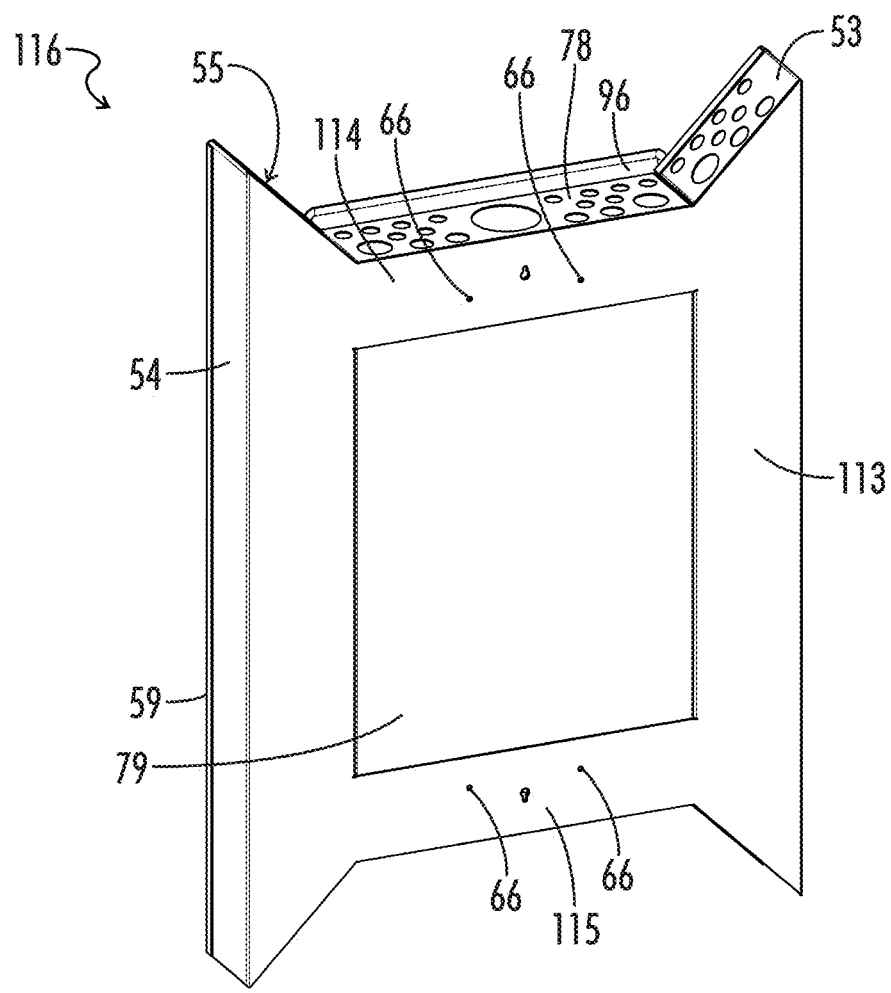
FIG. 10 is a three-dimensional perspective rear view with minor elevation and rotation of a third embodiment of the present invention, an existing enclosure and an existing cover where all elements are joined.

Referring now in particular to FIG. 10, a third embodiment of the present invention is illustrated in a 3D rear perspective view of full assembly 116. As illustrated in FIG. 10, all rear panel components of both structural cores 50 of the second embodiment have been replaced by a single, continuous rear panel 113. No other modifications are made to any other components of either assembly of novel components 95 or to assembly of novel components 109 apart from the rear panel. Accordingly, assembly 116 of this third embodiment is identical to assembly 110 of the second embodiment except for the rear panel adaptations described below. As visible in FIG. 10, instead of the overlapping rear panel portions illustrated in FIG. 9B, this third embodiment of the present invention has one rear panel 113 which extends from where rear panel 113 intersects side panel 54 on one side continuously across the rear of enclosure 78 to where rear panel 113 terminates at the intersection of the different side panel 54 on the other side. Portion 114 of rear panel 113 replaces the overlapping rear panel portions 65 of assembly 109 and rear panel portion 64 of assembly 95 with one continuous portion 114. Portion 115 of rear panel 113 replaces the overlapping rear panel portions 64 of assembly 109 and rear panel portion 65 of assembly 95. This is an improvement over the second embodiment in that it reduces complexity and improves the mechanical integrity of full assembly 116.

Figure 11A:
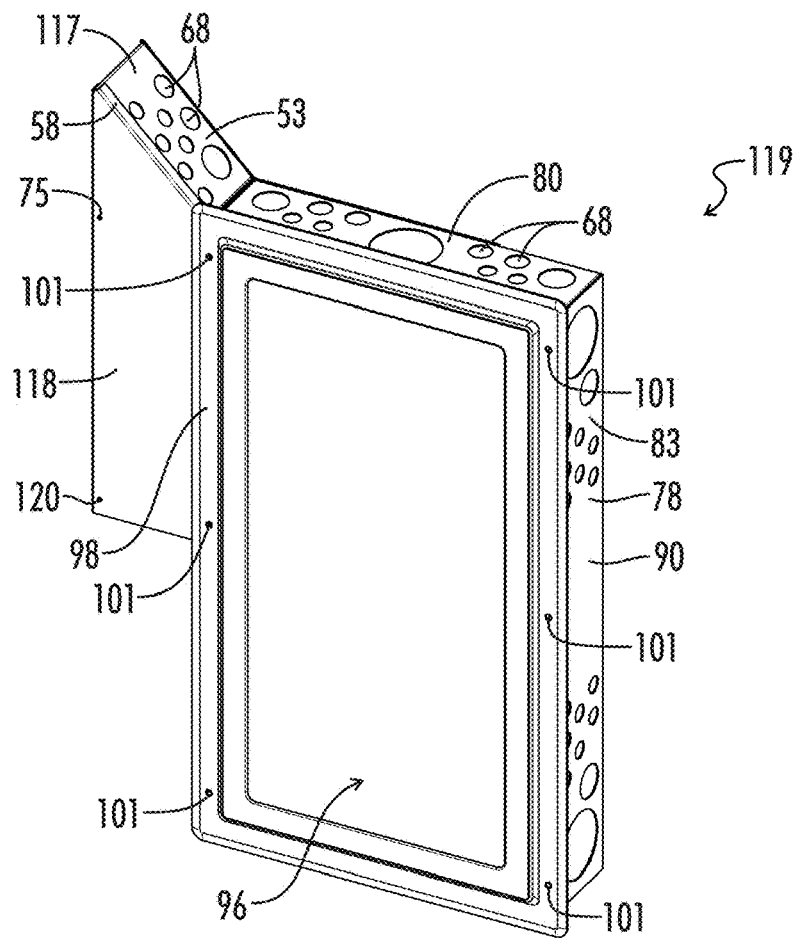
FIG. 11A is a three-dimensional perspective front view with minor elevation and rotation of a fourth embodiment of the present invention, an existing enclosure and an existing cover where all elements are joined.
Figure 11B:
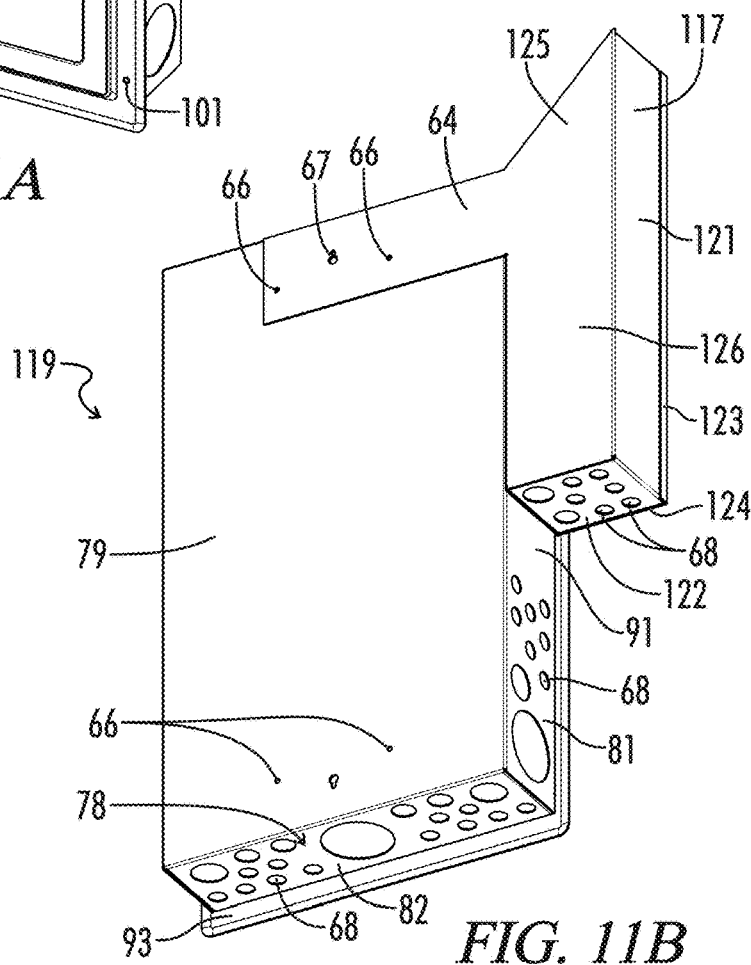
FIG. 11B is a three-dimensional perspective rear view with minor negative elevation and rotation of a fourth embodiment of the present invention, an existing enclosure and an existing cover where all elements are joined.

Referring now in particular to FIGS. 11A and 11B, each figure presents a 3D perspective view of a fourth embodiment of the present invention. FIG. 11A provides a front perspective view of a full assembly 119 of the fourth embodiment of the present invention and FIG. 11B provides a rear perspective view of the fourth embodiment of the present invention. Existing enclosure 78 and existing cover assembly 96 are unchanged from previous embodiments as described above. Full assembly 119 is adapted from full assembly 102 where those adaptations from a previously described first embodiment are described here including references to previously described unadapted components and functions within this fourth embodiment of the present invention. Angled top cable entry panel 53 remains unadapted from the first embodiment. Similarly, the attachment components to existing enclosure 78 as illustrated in FIG. 5A are unchanged, noting that due to the adaptations illustrated in FIGS. 11A and 11B there is no lower attachment point to enclosure 78 within this fourth embodiment of the present invention. The overall adaptation to the full assembly 102 of the first embodiment is the removal of nearly all of a lower portion of the assembly of novel components 95 as illustrated in FIG. 2A. More particularly, the remaining portion of this fourth embodiment of the present invention can be better described by first describing the halfway point of assembly 95 as it relates to this fourth embodiment. This particular midpoint is described as the midpoint of the edge of front panel 57 which is farthest from extended overhang lip 62 as illustrated in FIG. 1. A second midpoint point can be described as the midpoint of the edge of front panel extension panel 61 whose edge intersects with extended overhang lip 62. A third midpoint is defined by the location of one non-threaded hole 76 within extended panel 61 of cover panel 57 which is closest to full height portion 72 of core structure 50 as illustrated in FIG. 2A. A line can be drawn through the three above defined midpoints where that line demarcates the midpoint of assembly of novel components 95 as illustrated in FIG. 2A. Holes 76 which are illustrated in the example embodiments included in this description have locations which are fixed due to their alignment with threaded holes 94 within existing enclosure 78 and their additional alignment with non-threaded holes 101 within existing cover assembly 96. Therefore, any example embodiments which affix those example embodiments to existing enclosure 78 and existing cover assembly 96 must retain the location of any fixed holes 76 which are included in the particular example embodiment.

With the midpoint clearly defined as applied to the vertical dimension of an assembly of novel components 95 as illustrated in FIG. 2A, the adaptation producing this fourth embodiment of the present invention can be described as a termination of assembly 95 a short distance below the vertical axis midpoint of assembly 95 as the assembly 95 is illustrated in FIG. 2A. This adaptation results in a new structural core 117, and a similarly adapted new cover panel 118 as illustrated in FIGS. 11A and 11B. Core 117 includes a new rear panel 125 as illustrated in FIG. 11B which comprises a new rear panel portion 126 which terminates a short distance below the above-defined midpoint where portion 126 intersects with a new bottom cable entry panel 122, as well as an unchanged rear panel portion 64. New bottom panel 122 occupies a plane which is orthogonal to the plane containing rear panel 79 of enclosure 78. Bottom panel 122 contains an assortment of cable entry holes 68. Bottom panel 122 extends from the edge abutting featureless portion 91 of enclosure 78 side panel 81 to where it terminates along the lowest edge of new side panel 121. New side panel 121 is orthogonal to the plane containing bottom panel 122 and is orthogonal to the plane containing new rear panel 125. Side panel 121 extends from its lower edge at bottom panel 122 to its top edge at an unchanged panel 53 as illustrated in both FIGS. 11A and 11B. New cover panel 118 is similarly adapted and extends from an unchanged upper lip 58 to a new lip 124, which slightly overlaps bottom panel 122. Similarly adapted lip 123 extends from existing lip 58 to its termination at lip 124. Lip 123 occupies a plane orthogonal to the plane containing cover panel 118, to which lip 123 is attached as illustrated in FIGS. 11A and 11B. Not illustrated in the figures is a truncated discontinuous side panel 56 of structural core 117. Referring now to FIG. 1, portions 70, 71 and 72 of the first embodiment of the present invention are illustrated. Portions 70 and 71 of discontinuous side 56 are unadapted in this fourth embodiment of the present invention. Portion 72 of discontinuous side 56 is truncated within the fourth embodiment of the present invention such that a truncated portion 72 terminates at the edge of bottom panel 122 as panel 122 is illustrated in FIG. 11B. A new non-threaded hole 120 is illustrated in FIG. 11A within new cover panel 118. Hole 120 is similar in design and function to hole 75 within cover 118. Hole 120 aligns with a relocated cover securing tab which is not illustrated in the figures. The relocated cover securing tab is similar in design to the cover securing tabs illustrated in FIG. 1 and is aligned within core structure 117 to new hole 120.

Figure 12A:
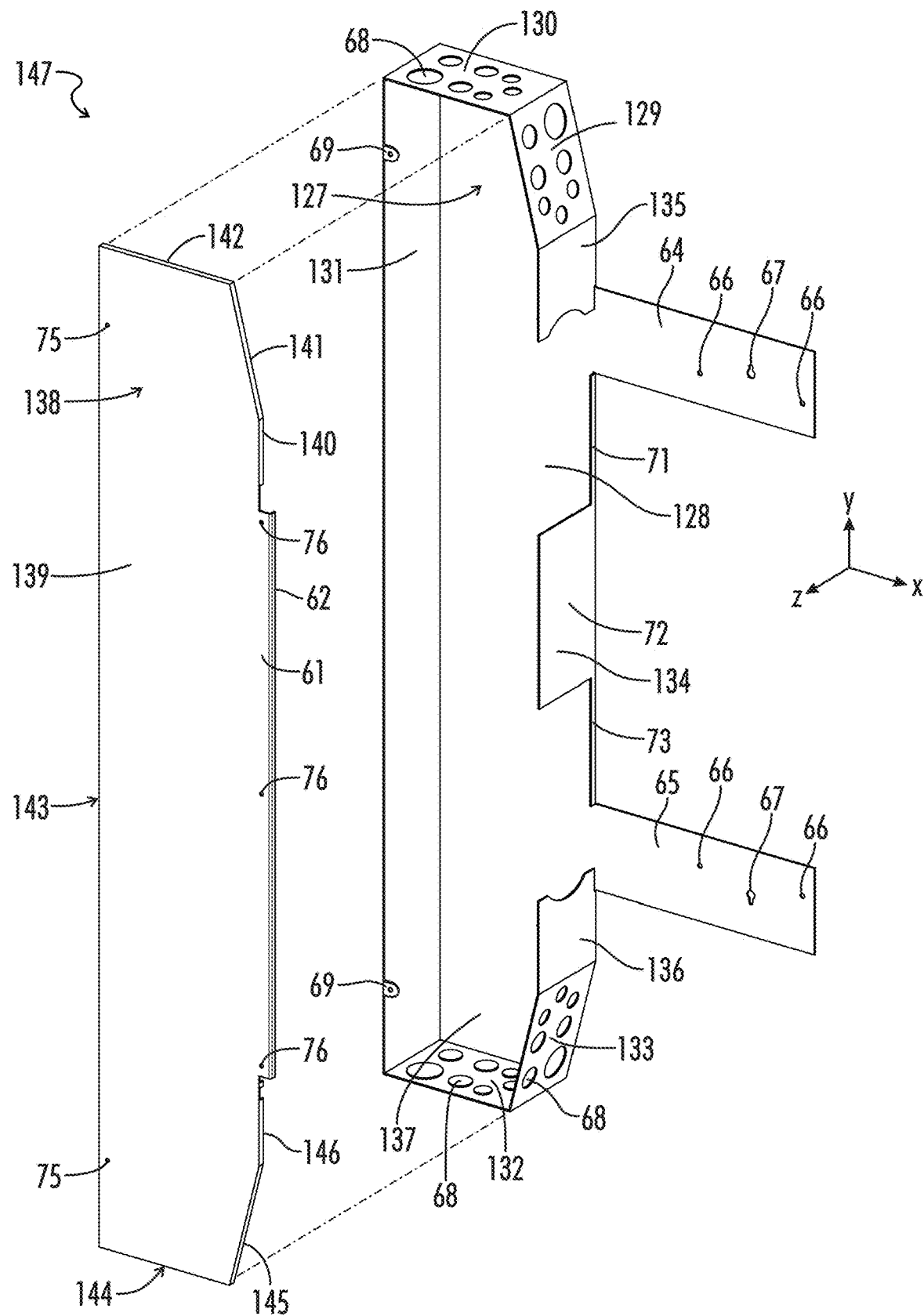
FIG. 12A is a three-dimensional perspective front view with minor elevation and rotation of a fifth embodiment of the present invention where elements are separated.
Figure 12B:
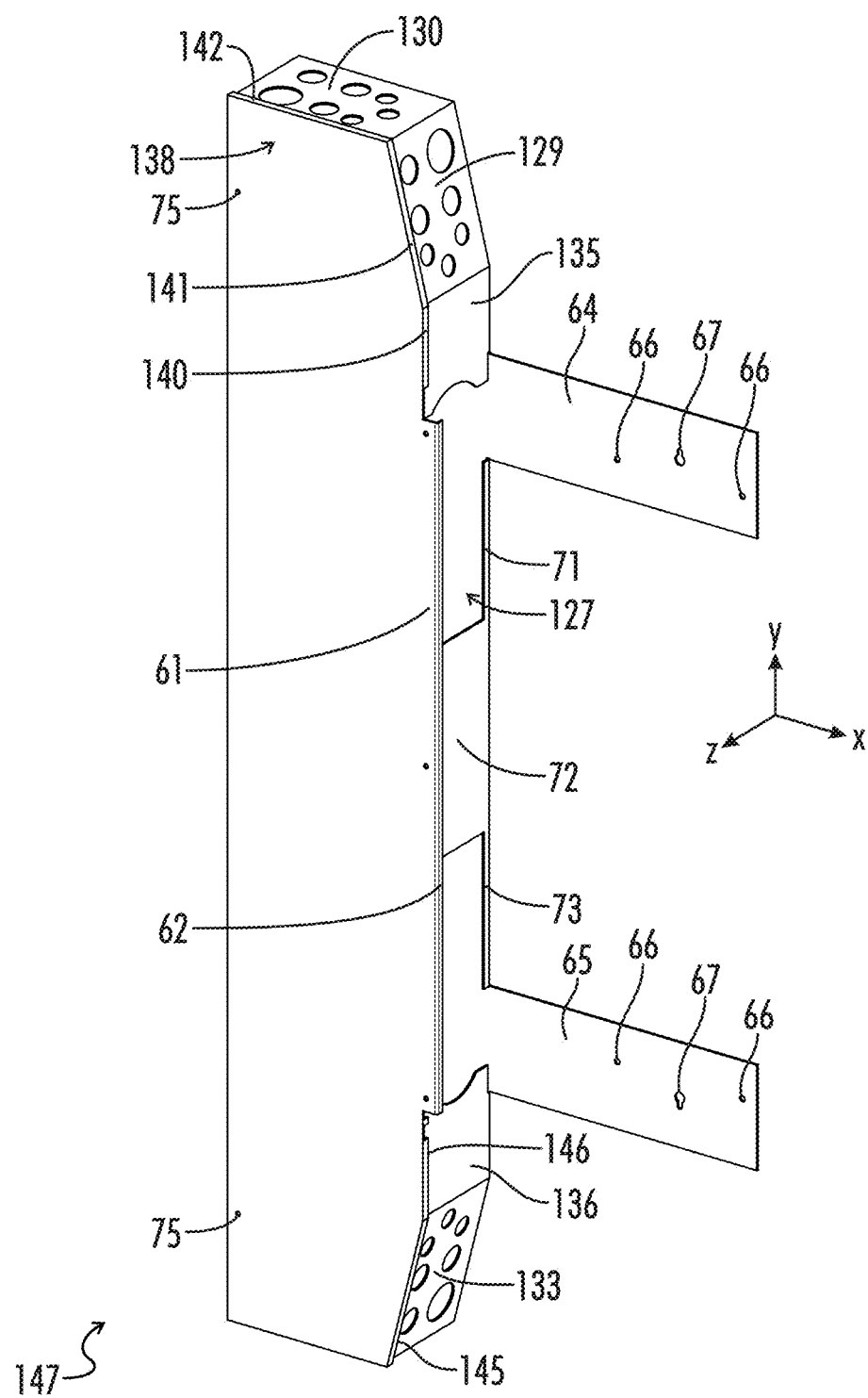
FIG. 12B is a three-dimensional perspective front view with minor elevation and rotation of a fifth embodiment of the present invention where elements are joined.

Referring now in particular to FIGS. 12A and 12B, a fifth embodiment of the present invention is illustrated. FIG. 12A presents a three-dimensional front perspective view of two adapted components of the fifth embodiment separated. A structural core 127 is illustrated as it has been adapted from structural core 50 as the structural core 50 is illustrated in FIG. 1. Core 127 comprises an adapted rear panel 128, an adapted angled upper cable entry panel 129, a new horizontal top cable entry panel 130, an adapted long side panel 131, a new horizontal bottom cable entry panel 132, an adapted angled lower cable entry panel 133 and an adapted discontinuous side panel 134. Adapted discontinuous side panel 134 comprises an adapted portion 135; unadapted portions 71, 72 and 73; and an adapted portion 136. Rear panel 128 of core 127 comprises three portions, an adapted interior portion 137, and unadapted rear panel portions 64 and 65. As is illustrated in FIG. 1, rear panel portions 64 and 65 each contain two non-threaded holes 66 and one keyed hole 67 in this fifth embodiment of the present invention. Floor panel portions 137, 64 and 65 are all coplanar. Rear panel portion 137 extends continuously from rear panel portions 64 and 65 to the rear edge edges of the following structural core 127 panels and panel portions: portion 135 of discontinuous side panel 134; angled upper panel 129; horizontal top panel 130; long side panel 131; horizontal bottom panel 132; angled lower panel 133; and portions 136, 71, 72 and 73 of discontinuous side panel 134. The following panels and panel portions extend orthogonally from the plane containing rear panel 128: portion 135 of discontinuous side panel 134; angled upper panel 129; horizontal top panel 130; long side panel 131; horizontal bottom panel 132; angled lower panel 133; and portions 136, 71, 72 and 73 of discontinuous side panel 134. All of the following panels and panel portions extend from rear panel 128 the same distance from rear panel 128 as is illustrated in FIG. 12A: portion 135 of discontinuous side panel 134; angled upper panel 129; horizontal top panel 130; long side panel 131; horizontal bottom panel 132; angled lower panel 133; and portions 136 and 72 of discontinuous side panel 134. Unadapted panel portions 71 and 73 of discontinuous side panel 134 extend a short distance from rear panel 128 as illustrated in FIG. 12A and is consistent with the first embodiment of the preferred invention. Structural core 127 panels 129, 130, 132 and 133 contain an assortment of cable entry holes 68. Structural core 127 long side panel 131 also contains two cover securing tabs 69 as illustrated in FIG. 12A.

Structural core 127 cover 138 is also illustrated in FIG. 12A. Cover 138 comprises front cover panel 139, front cover panel 139 overhang extension 61, cover lip panel 140, cover lip panel 141, cover lip panel 142, cover lip panel 143, cover lip panel 144, cover lip panel 145, cover lip panel 146 and overhang extension lip 62. Front cover panel 139 and front cover panel overhang extension 61 are coplanar. Cover lip 140 begins where it meets cover panel 139 as illustrated in FIG. 12A and extends a short distance towards core 127 as core 127 is illustrated in FIG. 12A. Cover lip 141 begins where it meets cover panel 139 as illustrated in FIG. 12A and extends a short distance towards structural core 127 as core 127 is illustrated in FIG. 12A. Cover lip 142 begins where it meets cover panel 139 as illustrated in FIG. 12A and extends a short distance towards structural core 127 as core 127 is illustrated in FIG. 12A. Cover lip 143 begins where it meets cover panel 139 as illustrated in FIG. 12A and extends a short distance towards structural core 127 as core 127 is illustrated in FIG. 12A. Cover lip 144 begins where it meets cover panel 139 as illustrated in FIG. 12A and extends a short distance towards structural core 127 as core 127 is illustrated in FIG. 12A. Cover lip 145 begins where it meets cover panel 139 as illustrated in FIG. 12A and extends a short distance towards structural core 127 as core 127 is illustrated in FIG. 12A. Cover lip 146 begins where it meets cover panel 139 as illustrated in FIG. 12A and extends a short distance towards structural core 127 as core 127 is illustrated in FIG. 12A. Cover lips 140, 141, 142, 143, 144, 145 and 146 all extend the same short distance from cover front panel 139 and together form a contiguous lip traveling part way around the perimeter of cover front panel 139 as illustrated in FIG. 12A and described above. Overhang extension 61, overhang extension lip 62, and no threaded holes 76 within cover 138 are unadapted from a first preferred embodiment and operate as described. Cover panel 139 contains two non-threaded holes 75 which are located to align with two cover securing tabs as illustrated in FIG. 12A.

Referring now in particular to FIG. 12B, a three-dimensional perspective view from the same perspective as FIG. 12A of assembly of novel components 147 is presented. Assembly of novel components comprises structural core 127 and cover 138, assembled together as they would be if they were installed onto an existing enclosure 78, but without enclosure 78 present. Assembly 147 installs onto existing enclosure 78 in the same manner as a first preferred embodiment of the present embodiment installs onto existing enclosure 78. In particular, components 61, 62, 64, 65, 66, 71, 72 and 73 are unadapted from the first embodiment and function as described above. Although portion 135 of discontinuous side panel 134 of structural core 127 has been adapted from a first embodiment of the present invention, the lower portion of portion 135 which abuts the top of enclosure 78 side panel 81, as 81 is illustrated in FIG. 2B, is identical to portion 70 of discontinuous side 56 as 56 is illustrated in FIG. 2C. Similarly, although portion 136 of discontinuous side panel 134 of structural core 127 has been adapted from a first embodiment of the present invention, the upper portion of portion 136 which abuts the bottom of enclosure 78 side panel 81, as the panel 81 is illustrated in FIG. 3B, is identical to portion 74 of discontinuous side 56 as 56 is illustrated in FIG. 2A.

Figure 13A:
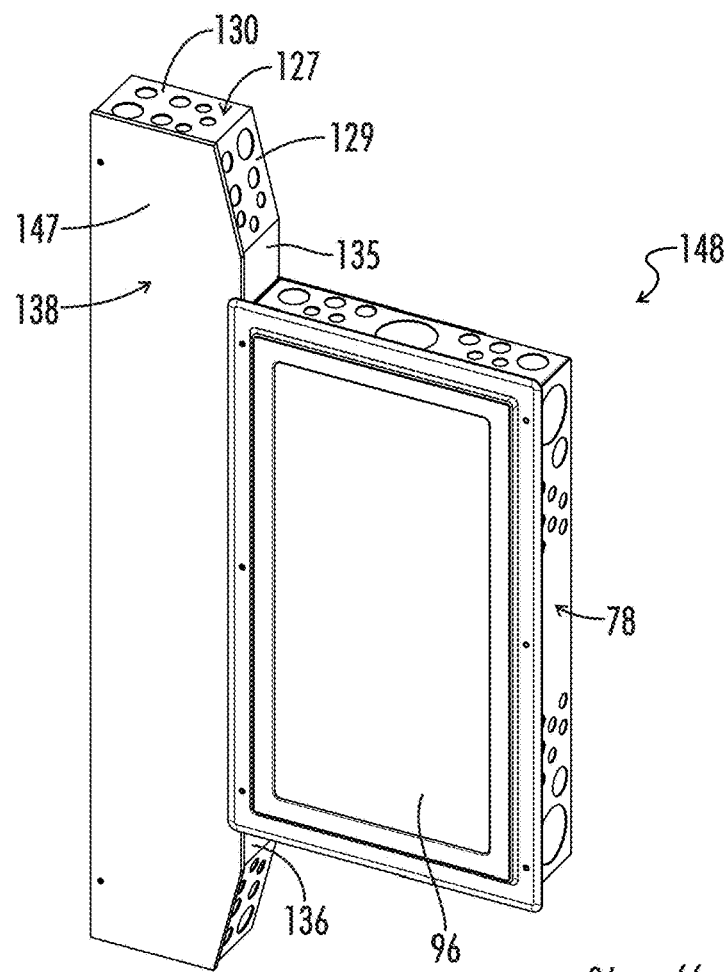
FIG. 13A is a three-dimensional perspective front view with minor elevation and rotation of a fifth embodiment of the present invention, an existing enclosure and an existing cover where all elements are joined.

Referring now in particular to FIG. 13A, a three-dimensional front perspective view of full assembly 148 of a fifth preferred embodiment of the present invention is illustrated. Full assembly 148 comprises assembly of novel components 147, existing enclosure 78 and existing cover assembly 96. Novel structural core 127 and novel cover 138 are visible incorporated into full assembly 148. A portion of adapted portion 135 of discontinuous side 134 is visible in FIG. 13A which is the adapted portion 135. As described above, the unadapted portion of 135 is identical to portion 70 of discontinuous side panel 56 as side panel 56 is illustrated in FIG. 2A, and is therefore concealed within full assembly 148.

Figure 13B:
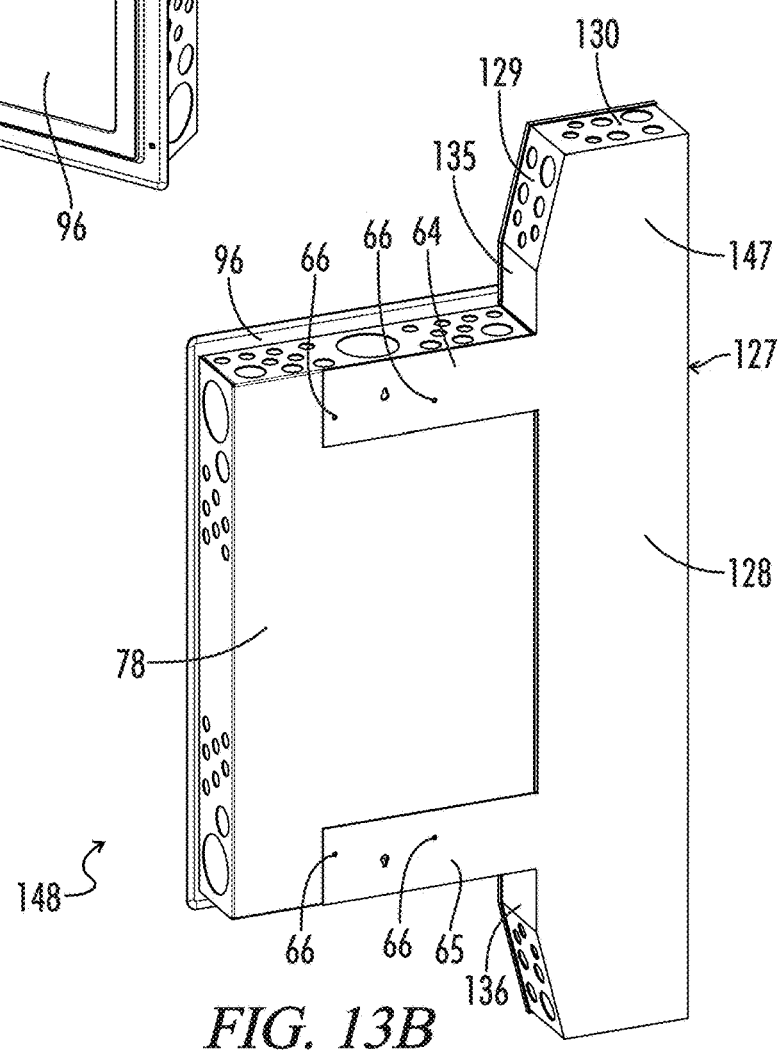
FIG. 13B is a three-dimensional perspective rear view with minor elevation and rotation of a fifth embodiment of the present invention, an existing enclosure and an existing cover where all elements are joined.

Referring now in particular to FIG. 13B, a three-dimensional rear perspective view of full assembly 148 of a fifth preferred embodiment of the present invention is illustrated. When assembled into full assembly 148, holes 66 within rear panel portion 64 and within rear panel portion 65 align with all four holes 93 within rear panel 79 of enclosure 78 as 78 is illustrated in FIG. 3B.

The novel components of the present invention may be constructed of any materials which can provide the structural integrity which is standard in the art of electrical enclosures. Some examples of materials include sheet steel, which can be bent or otherwise formed into the novel components of the present invention using standard methods and practice known in the art; or non-conductive rigid plastic which can be formed using existing methods known in the art.

The novel components of the present invention may be constructed from sheet steel, in a manner that is known in the existing art of sheet steel electrical enclosures. Sides may be formed by bending an originally flat sheet of metal, which is shaped such that bending in preferred locations will result in any or all of the electrical enclosures described above. Often electrical enclosures are designed to be safe and effective in the interiors of buildings only, where they are not expected to be exposed to the outdoor elements or otherwise exposed to quantities of water which might cause electrical faults. Accordingly, it is common in the art of sheet steel electrical enclosures that some panel intersections or corners result from adjacent sides having been bent into place from a flat sheet and resulting in a corner which is a meeting of the two sides, but which may contain a small gap which is unclosed between the two otherwise intersecting sides. In other applications of sheet steel formed enclosures, these adjacent side panels which meet to form a corner may be welded together, which would provide increased structural integrity as well as a continuous seal between the two sides which meet at a corner. However, any two panels or sides which meet to form a corner as is described above in the preferred embodiments of the present invention may be the termination of those two panels at the described location forming the corner as described while not being joined together with a continuous weld or other joining technology known in these arts. Alternatively to a corner between two panels of the above described embodiments of the present invention being the intersection of two panels without a joining, a corner where two panels meet as described in the present invention may result from the bending of a flat sheet where the flat sheet has portions which when bent using methods know in the arts of sheet steel forming result in one or more of the above described panels. Such a corner resulting from a bend will be a continuous corner due to the bend, and will also include a small radius which is a standard result of existing methods of sheet steel forming. All of the panel intersections of the contiguous components of the present invention are formed to the existing standards and practices for interior dry location installations of electrical enclosures.

Each of the preferred embodiments of the present invention as described above may be adapted to be suitable for installation where exposure to wet conditions would be expected. Any adaptations for deployment to wet locations such as the exterior of a building would be applications of standard methods and practices of adapting electrical enclosures for such exposure.

These preferred embodiments of the present invention contain at least one angled cable entry panel. This angle is here defines as the angle between the cable entry panel in question and a horizontal line where that horizontal line intersects the angled panel at its edge which is closest to any portion of either discontinuous side panel 56 or discontinuous panel 134 and the angle of the angled panel is defined as the angle between the angled panel and the portion of the horizontal line which is also between long side panel 54, or side panel 121 or long side 131. For example, the angle for angled panel 53, as illustrated in FIG. 1, is 45 degrees from horizontal. Similarly, that angle for angled panel 133 is estimated to be 70 degrees. Within these figures only two different angles illustrated in the figures between an angled panel and horizontal are 45 degrees and approximately 70 degrees. These two angles are selections among many and shall not be limiting to the scope of the present invention. Any angle between an angled panel and a horizontal line which also extends through a side panel 54, 121 or 131, where that angle is greater than zero degrees would provide some utility and at least somewhat decrease the required length of a branch circuit cable which is to be relocated from an existing enclosure such as enclosure 78 through an angled panel as contained in the present invention. Similarly, an angle of 90 degrees would appear as a vertical cable entry panel extending from a portion of a discontinuous side panel 56 or 134 in the same plane as that which contains panel 56 or 34. This might also have utility in enabling branch circuit cables to reach an angled cable entry panel. Any angle greater than 90 degrees is, however, excluded from the present invention as utility will decrease with an angle greater than 90 degrees.

The foregoing description has been presented for purposes of illustration and description and is not intended to be exhaustive or to limit the invention to the precise form disclosed. The descriptions were selected to explain the principles of the invention and their practical application to enable others skilled in the art to utilize the invention in various embodiments and various modifications as are suited to the particular use contemplated. Although particular constructions of the present invention have been shown and described, other alternative constructions will be apparent to those skilled in the art and are within the intended scope of the present invention.

The invention claimed is:

1. An electrical enclosure assembly for attachment to an existing electrical enclosure comprising:

an enclosure structural core having a rear panel and side panels defining an interior of the enclosure structural core, the side panels including a top side panel, a bottom side panel, a long side panel, and a discontinuous short side panel that surround a top opening, the long side panel longer than the discontinuous short side panel;

the rear panel having a main portion and an extension portion co-planar with the main portion, the extension portion extending from the main portion beyond the discontinuous short side panel and configured to be secured to the existing electrical enclosure;

at least one of the top or bottom side panels having one or more structural core cable entry points defined therein, an obtuse angle being formed between the discontinuous short side panel and the at least one of the top or bottom side panels, the at least one of the top or bottom side panels positioned to receive branch circuit electrical cables relocated from the existing electrical enclosure without additional cable length required;

the discontinuous short side panel having a panel opening configured to be positioned in alignment with one or more existing cable entry points in the existing electrical enclosure when the enclosure structural core is secured to the existing electrical enclosure; and an openable cover securable over the top opening for providing access to the interior of the enclosure structural core, the openable cover having an extended overhang portion which extends outwardly over the discontinuous short side panel and abuts against and is configured to be secured to the existing electrical enclosure, wherein when the electrical enclosure assembly is secured to the existing electrical enclosure, the enclosure structural core is an additional electrical enclosure.

2. The electrical enclosure assembly of claim 1 additionally comprising surface mount holes in the extension portion of the rear panel, the surface mount holes configured to be aligned with corresponding mounting holes in the existing electrical enclosure.

3. The electrical enclosure assembly of claim 1 wherein the discontinuous short side panel additionally comprises a center portion, an end portion adjacent to one of the top side panel and the bottom side panel, an intermediate portion positioned between the center portion and the end portion, the intermediate portion having a height narrower than either of the center portion and the end portion, the center portion is coplanar with the intermediate portion and the end portion, and the panel opening in the discontinuous short side panel located between the main portion and short end portion, the discontinuous short side panel being configured to abut against a side panel of the existing electrical enclosure, the existing electrical enclosure has one or more existing cable entry points in the side panel, the panel opening positioned in alignment with the one or more existing cable entry points.

4. The electrical enclosure assembly of claim 1 wherein each of the top and bottom side panels have the one or more structural core cable entry points defined therein, the top side panel having the obtuse angle formed between the top side panel and the long side panel, the bottom side panel having the obtuse angle formed between the bottom side panel and the long side panel, each of the top and bottom side panels configured to be positioned adjacent an existing top panel or an existing bottom side panel, respectively, in the existing electrical enclosure, and each of the top and bottom side panels of the enclosure structural core configured to receive the branch circuit electrical cables relocated from the existing electrical enclosure.

5. The electrical enclosure assembly of claim 1 wherein the rear panel additionally comprises another extension portion co-planar with the main portion, the another extension portion connected to and extending outwardly from the main portion and configured to be connected to the existing electrical enclosure.

6. The electrical enclosure assembly of claim 5 additionally comprising rear surface mount holes in both of the extension and another extension portions of the rear panel configured to be aligned with corresponding mounting holes in the existing electrical enclosure.

7. The electrical enclosure assembly of claim 6 additionally comprising rear keyed holes in both of the extension and another extension portions of the rear panel configured to be aligned with upper and lower keyed holes in the existing electrical enclosure.

8. The electrical enclosure assembly of claim 3 wherein when the enclosure structural core is secured to the existing side panel of the existing electrical enclosure, the existing side panel extends over the panel opening in the discontinuous short side panel of the enclosure structural core such that the electrical enclosure assembly is suitable for housing the branch circuit electrical cables.

9. The electrical enclosure assembly of claim 1 additionally comprising at least two threaded holes in the long side panel of the enclosure structural core positioned to be aligned with corresponding holes in the openable cover for securing the openable cover over the top opening of the enclosure structural core.

10. The electrical enclosure assembly of claim 4 wherein when the enclosure structural core is installed to the existing electrical enclosure, each of the top and bottom side panels that are angled meet a respective linear corner of the existing electrical enclosure.

11. The electrical enclosure assembly of claim 1 wherein the enclosure structural core is formed of a single piece of bent steel sheet.

12. The electrical enclosure assembly of claim 1 additionally comprising one or more knockouts in the one or more structural core cable entry points of the enclosure structural core.

13. The electrical enclosure assembly of claim 1 wherein the extended overhang portion of the openable cover comprises an extended cover portion which extends outwardly over the discontinuous short side panel and an inwardly directed lip which extends on an outer side of and substantially parallel to the discontinuous short side panel, the inwardly directed lip configured to extend inwardly towards an interior of the existing electrical enclosure.

14. The electrical enclosure assembly of claim 1 additionally comprising a plurality of more structural core cable entry points including the one or more structural core cable entry points, wherein the plurality of structural core cable entry points are of variable sizes.

15. The electrical enclosure assembly of claim 1 wherein the cover additionally comprises a first lip overhang configured to cover a portion of the top side panel, a second lip overhang configured to cover a portion of the bottom side panel, and a third lip overhang configured to cover a portion of the long side panel.

16. The electrical enclosure assembly of claim 1 wherein the side panels additionally including at least one of:
a horizontal top side panel positioned between the long side panel and the top side panel that is angled, or
a horizontal bottom side panel positioned between the long side panel and the bottom side panel that is angled.

* * * * *